United States Patent
Shiraishi

(10) Patent No.: US 8,947,750 B2
(45) Date of Patent: *Feb. 3, 2015

(54) IMAGING DEVICE ARRAY AND IMAGE FORMING APPARATUS

(71) Applicant: Toshiba Tec Kabushiki Kaisha, Tokyo (JP)

(72) Inventor: Takashi Shiraishi, Kanagawa (JP)

(73) Assignee: Toshiba Tec Kabushiki Kaisha, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/901,207

(22) Filed: May 23, 2013

(65) Prior Publication Data

US 2013/0314754 A1  Nov. 28, 2013

(30) Foreign Application Priority Data

May 23, 2012  (JP) .................................. 2012-117729

(51) Int. Cl.
| | |
|---|---|
| *H04N 1/04* | (2006.01) |
| *H04N 1/46* | (2006.01) |
| *H01L 27/146* | (2006.01) |
| *H04N 1/00* | (2006.01) |
| *H04N 1/031* | (2006.01) |
| *G02B 13/26* | (2006.01) |

(Continued)

(52) U.S. Cl.
CPC ...... *H01L 27/14629* (2013.01); *H04N 1/00997* (2013.01); *H04N 1/0311* (2013.01); *G02B 13/26* (2013.01); *G02B 17/086* (2013.01); *G02B 3/0068* (2013.01)
USPC ............ 358/475; 358/482; 358/483; 358/509

(58) Field of Classification Search
CPC . H04N 1/193; H04N 3/1581; H04N 1/40056; H04N 1/031; H04N 1/03; H04N 2201/03138; H04N 1/02815; H04N 2201/02831; H04N 1/028; H04N 2201/02884; H04N 1/1013; H04N 1/484; H04N 1/12; H01L 27/14665
See application file for complete search history.

(56) References Cited

U.S. PATENT DOCUMENTS

| | | | |
|---|---|---|---|
| 5,663,833 A * | 9/1997 | Nanba et al. .................. | 359/631 |
| 6,894,263 B2 * | 5/2005 | Fujibayashi et al. ........ | 250/208.1 |
| 7,016,124 B2 * | 3/2006 | Hatakeyama et al. ........ | 359/729 |

(Continued)

FOREIGN PATENT DOCUMENTS

| | | |
|---|---|---|
| JP | H04-37801 | 2/1992 |
| JP | 2002-169092 | 6/2002 |

(Continued)

OTHER PUBLICATIONS

Office Action dated Jul. 8, 2014, filed in Japanese Patent Application No. 2012-117729, with English translation.

*Primary Examiner* — Cheukfan Lee
(74) *Attorney, Agent, or Firm* — Patterson & Sheridan LLP.

(57) ABSTRACT

According to one embodiment, an imaging device array includes a plurality of imaging devices integrally including an incidence surface that converges light in the primary scanning direction, plural reflective surfaces that reflect light from the incidence surface multiple times, and an exit surface through which light that has reflected at the plural reflective surfaces exits the array. At least one of the plural reflective surfaces is formed at the apex of a protrusion that protrudes outwardly from the surface of the array, and the light that is output from the exit surface is imaged at an image point.

20 Claims, 44 Drawing Sheets

(51) Int. Cl.
*G02B 17/08* (2006.01)
*G02B 3/00* (2006.01)

(56) References Cited

U.S. PATENT DOCUMENTS

| | | | | |
|---|---|---|---|---|
| 7,106,527 | B2* | 9/2006 | Sunaga et al. | 359/729 |
| 7,253,928 | B2* | 8/2007 | Tochigi et al. | 358/408 |
| 7,385,733 | B2* | 6/2008 | Sunaga | 358/471 |
| 7,414,761 | B2* | 8/2008 | Tochigi et al. | 358/483 |
| 7,715,060 | B2* | 5/2010 | Suga et al. | 358/474 |
| 7,903,310 | B2* | 3/2011 | Sugita et al. | 359/35 |
| 8,134,755 | B2* | 3/2012 | Suga | 358/474 |
| 8,284,462 | B2* | 10/2012 | Abe et al. | 358/484 |
| 2013/0100514 | A1 | 4/2013 | Shiraishi | |
| 2013/0107333 | A1* | 5/2013 | Hayashide et al. | 358/494 |
| 2013/0314797 | A1* | 11/2013 | Shiraishi | 359/627 |

FOREIGN PATENT DOCUMENTS

| | | |
|---|---|---|
| JP | 2005-070519 | 3/2005 |
| JP | 2006-062227 | 3/2006 |

\* cited by examiner

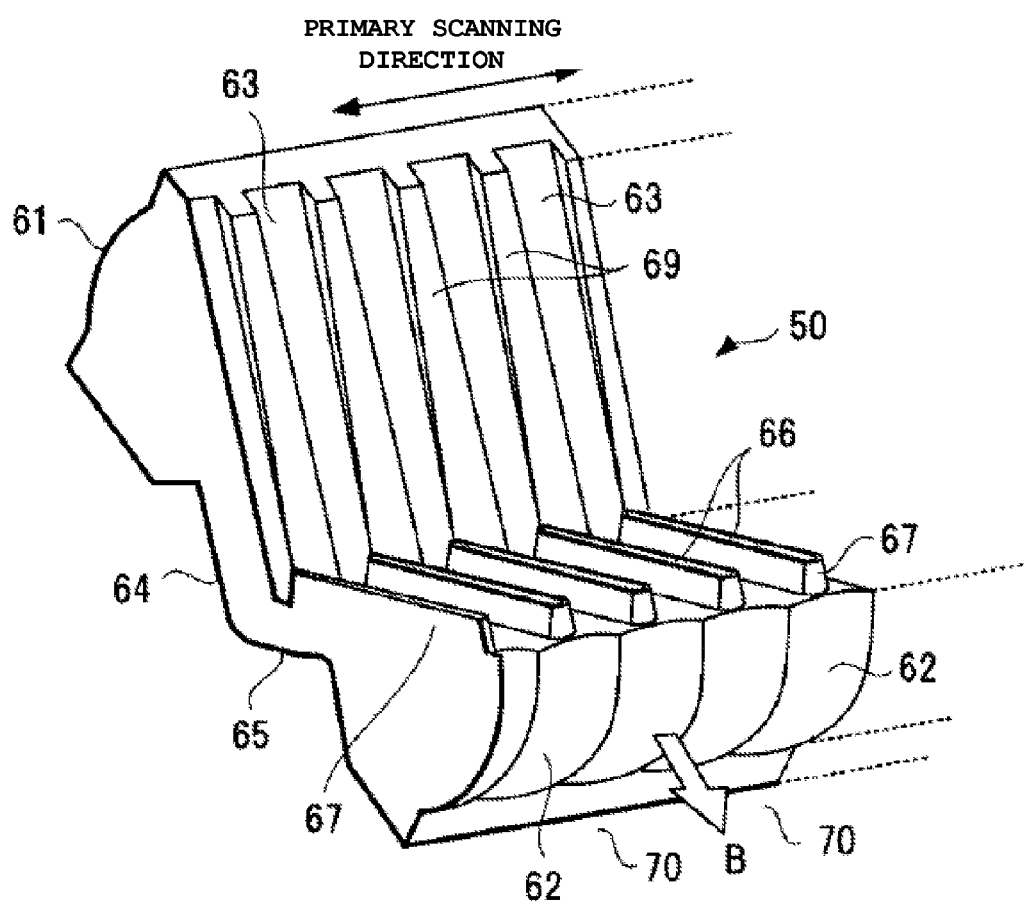

FIG. 6A
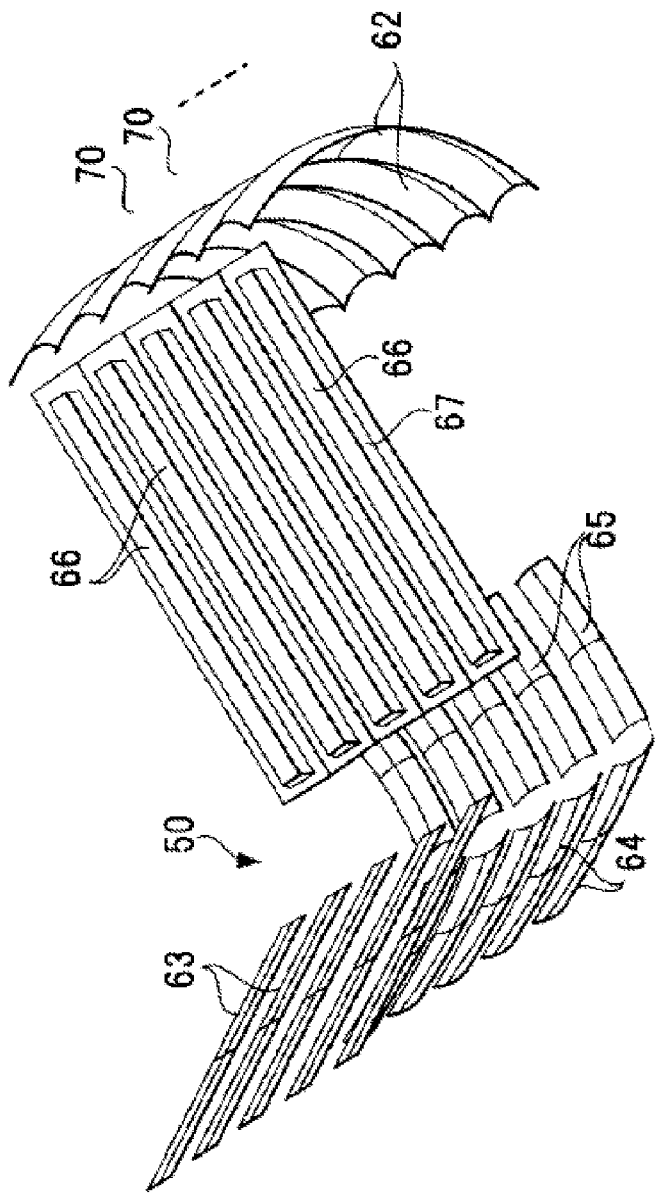
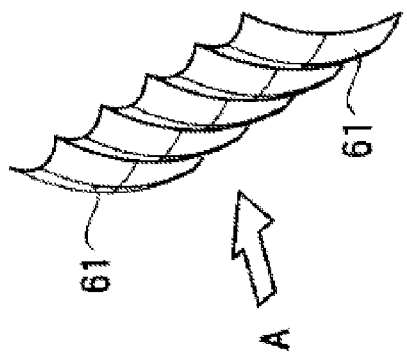

PRIMARY SCANNING DIRECTION

PRIMARY SCANNING
DIRECTION

PRIMARY SCANNING
DIRECTION

PRIMARY SCANNING DIRECTION

PRIMARY SCANNING DIRECTION

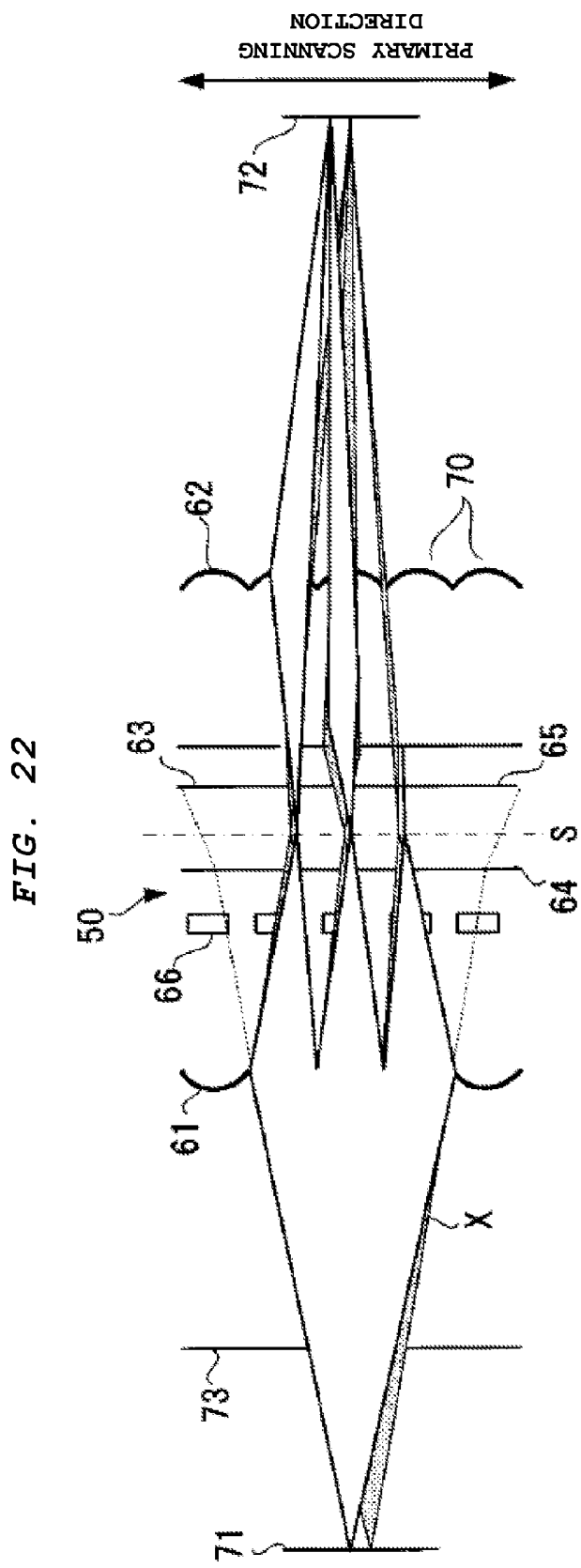

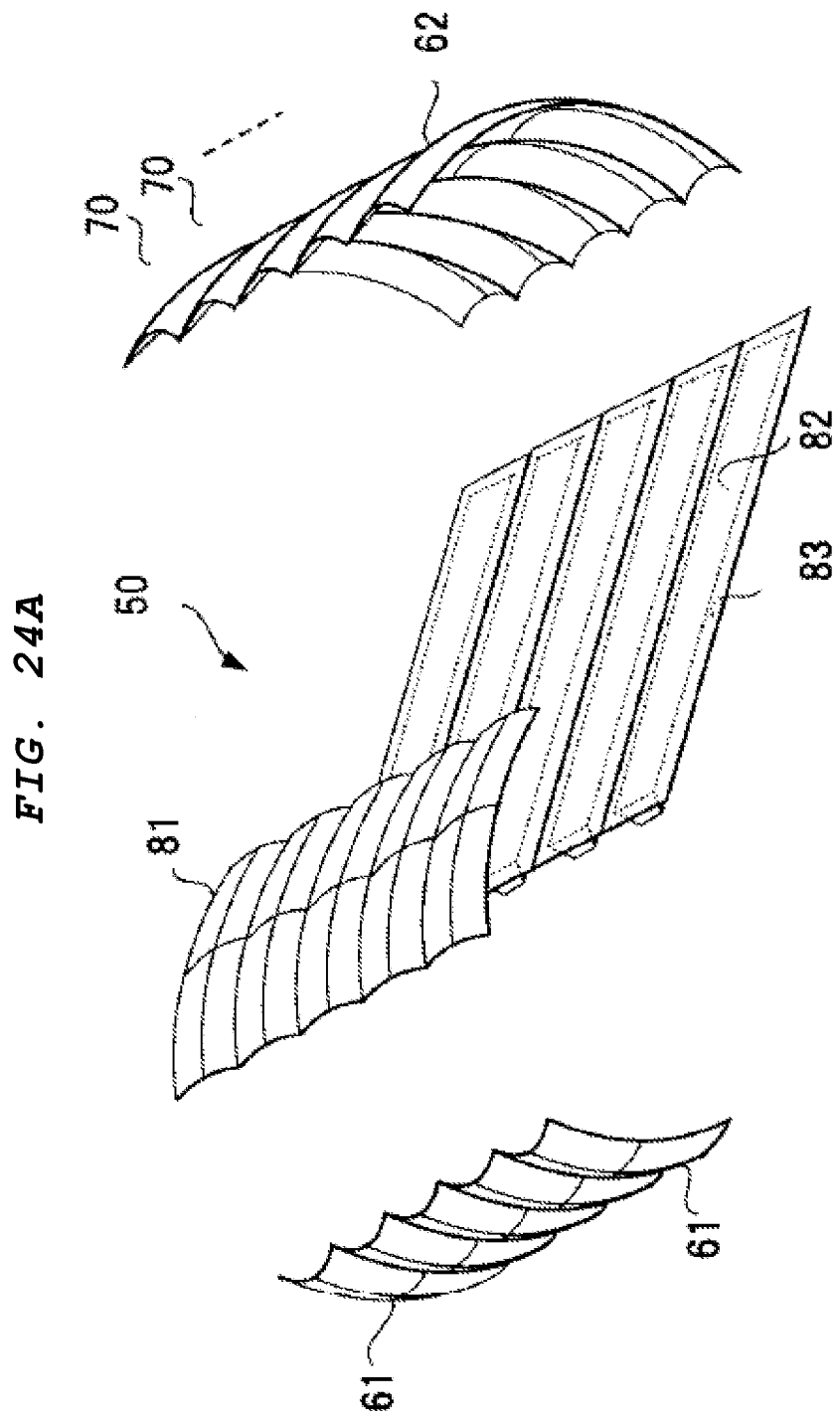

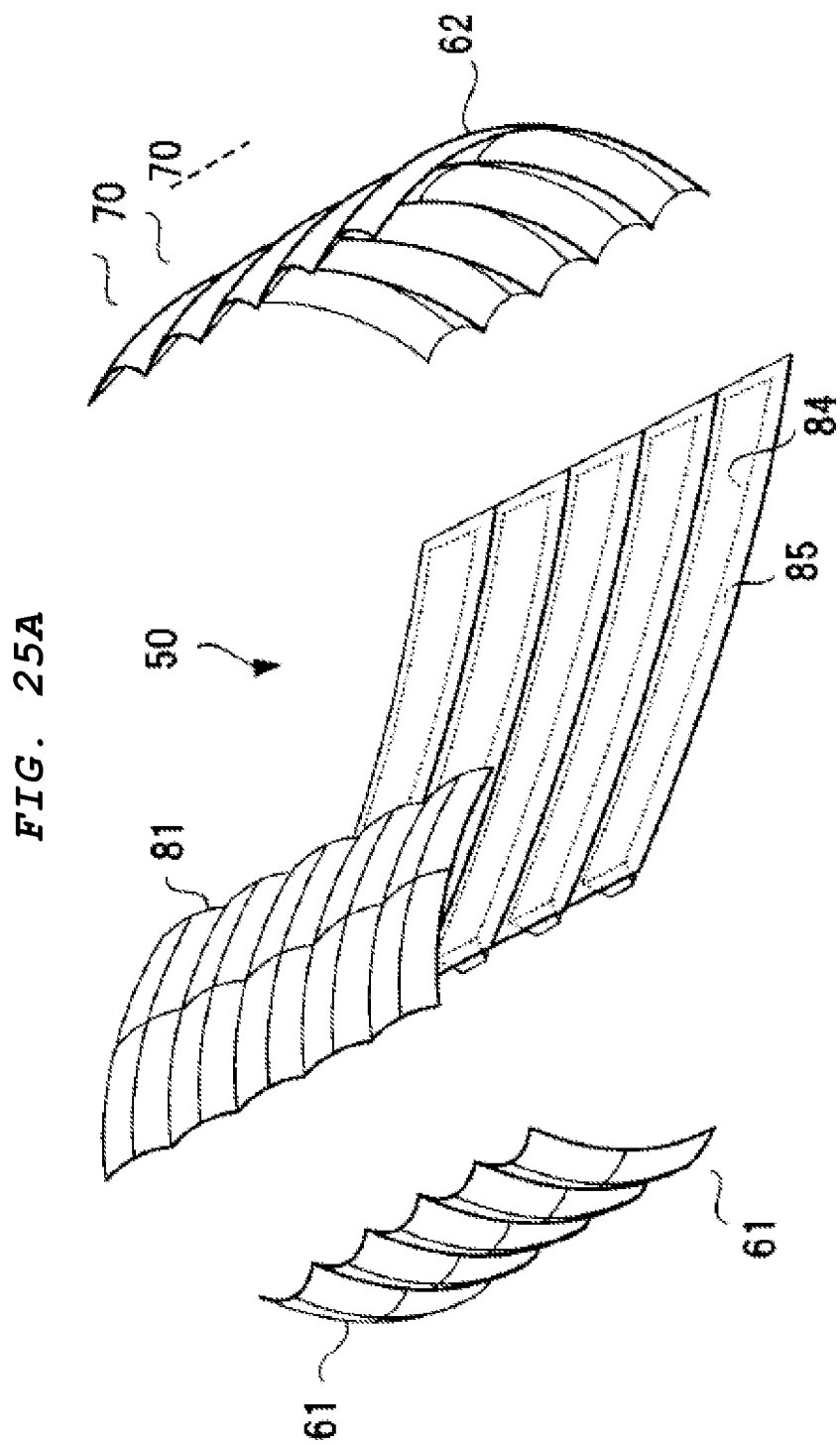

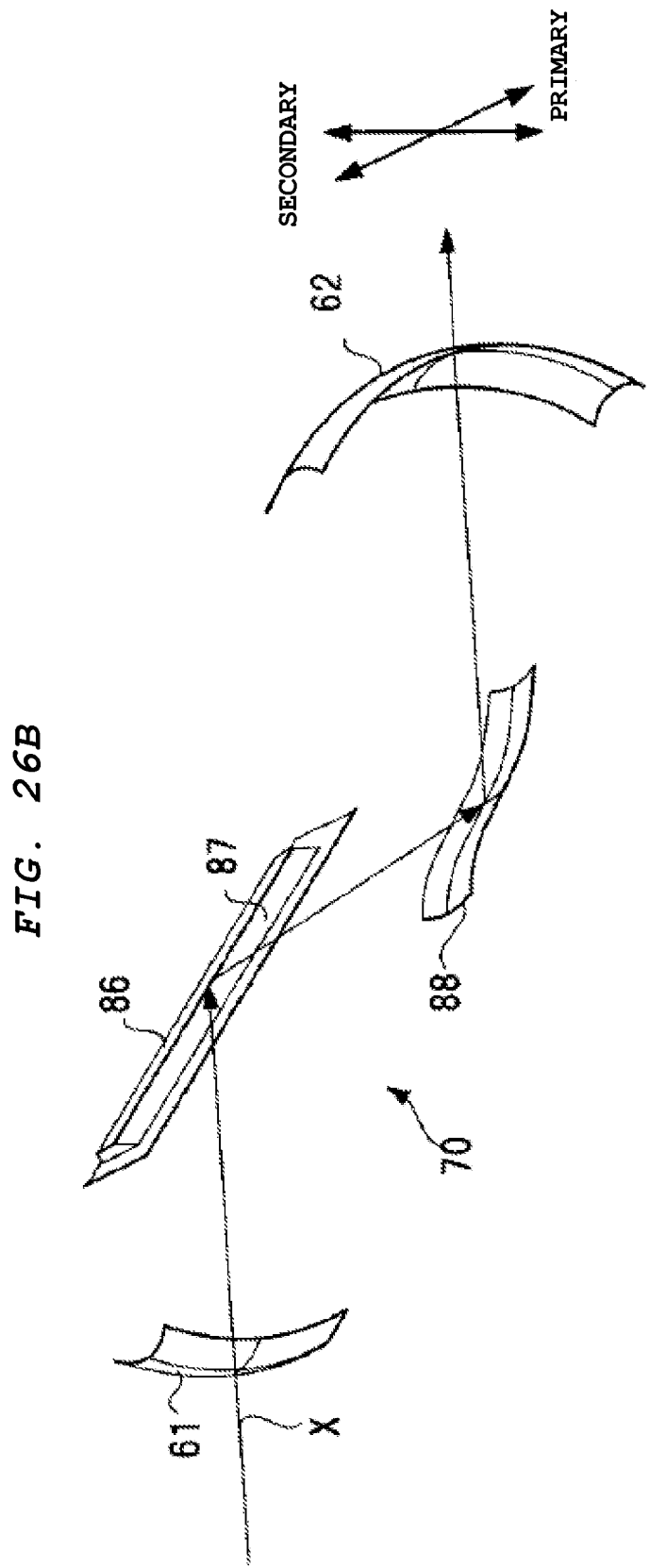

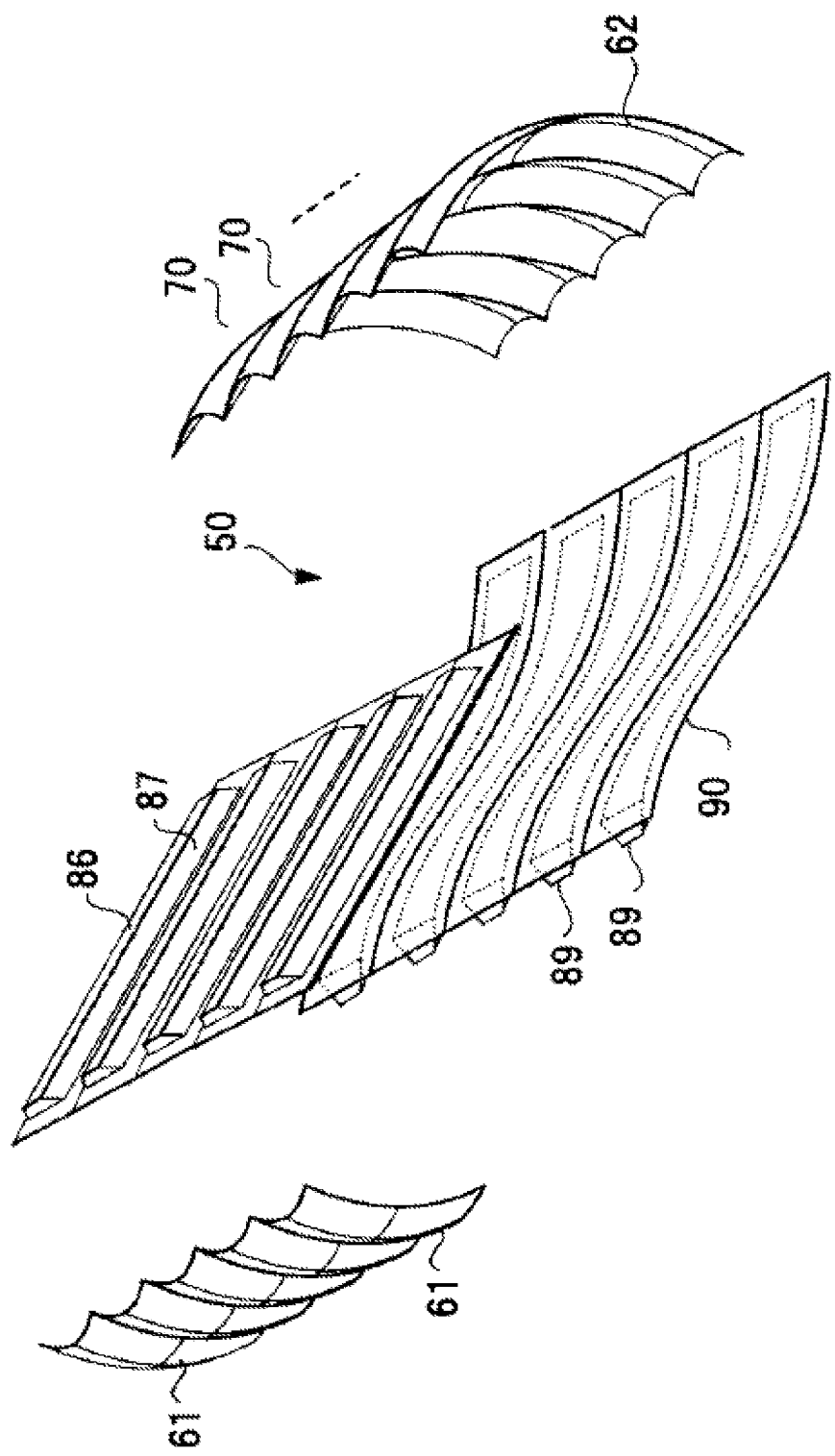

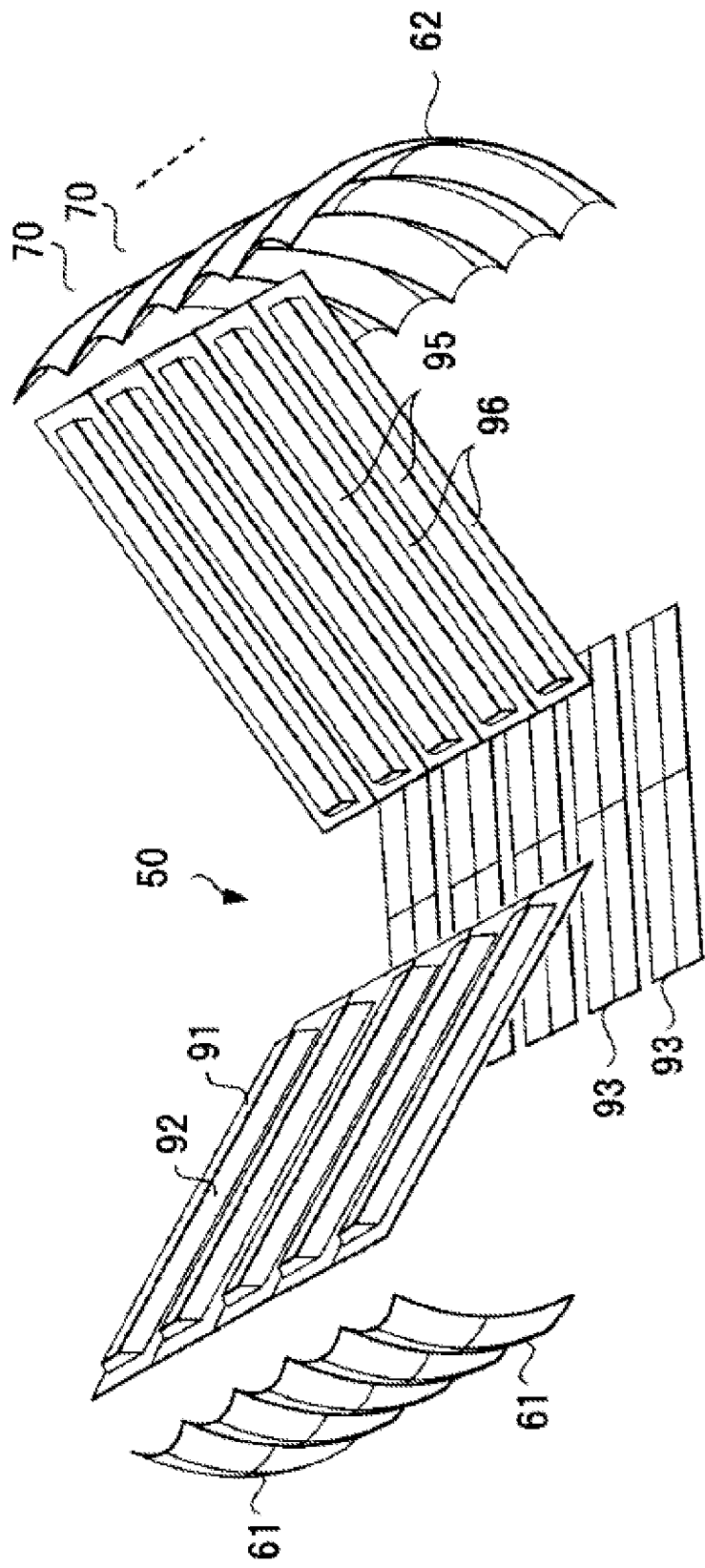

IMAGING DEVICE ARRAY AND IMAGE FORMING APPARATUS

CROSS-REFERENCE TO RELATED APPLICATION

This application is based upon and claims the benefit of priority from Japanese Patent Application No. 2012-117729, filed May 23, 2012; the entire contents of which are incorporated herein by reference.

FIELD

The embodiments described herein relate generally to an imaging device array including lenses and mirrors and an image forming apparatus using the imaging device array.

BACKGROUND

In the related art, in scanners, copiers, multifunction peripherals (MFP), and other image forming apparatuses, an illuminating apparatus and a lens array having plural lenses arranged in the array are adopted to enable an image sensor to read an image on a document. In addition, in printers, copiers, multifunction peripherals (MFP), or other image forming apparatuses, an LED or other light emitting device and a lens array are adopted to enable imaging of light rays from the LED on a photoreceptor drum via the lens array so that an image is formed on the photoreceptor drum (exposure). Here, the lens array is formed as a combination of plural lenses and apertures.

However, for the lens array, if optical axes of the lenses that are both used for the passing of a light ray therethrough are offset from each other, the unevenness in the imaging characteristics and the light quantity degrades significantly. Also, when the plural lenses and the apertures are combined, the offset in the assembly operation leads to degradation in the performance of the imaging device and a rise in the manufacturing cost.

JP-A-2005-70519 proposed a scheme to avoid the degradation in the performance caused by the unevenness in the assembly of transparent devices to form a monolithic body. In this case, in an array having plural imaging devices each containing a lens surface and a roof mirror prism arranged in the array, a light shielding part is formed by a deep slit between the imaging devices. However, there is a problem of the depth of the light shielding part being deep and poor flow of resin during molding of the lens, etc., prolonging the forming time thereof.

DESCRIPTION OF THE DRAWINGS

FIG. 5 is a perspective view illustrating the imaging device array according to the first embodiment as viewed from the exit surface of light.

FIGS. 6A and 6B are schematic perspective views illustrating the configuration of the imaging device array according to the first embodiment.

FIG. 22 is a diagram illustrating the optical path of the imaging device array according to the second embodiment as viewed in the secondary scanning direction.

FIGS. 24A and 24B are diagrams illustrating the configuration of an imaging device array according to a third embodiment.

FIGS. 25A and 25B are diagrams that show an alternative example of the imaging device array according to the third embodiment.

FIGS. 26A and 26B are diagrams that show another alternative example of the imaging device array according to the third embodiment.

FIGS. 27A and 27B are diagrams that show yet another alternative example of the imaging device array according to the third embodiment.

FIGS. 30A and 30B are diagrams that show another alternative example of the imaging device array according to the fourth embodiment.

DETAILED DESCRIPTION

Figure 1:
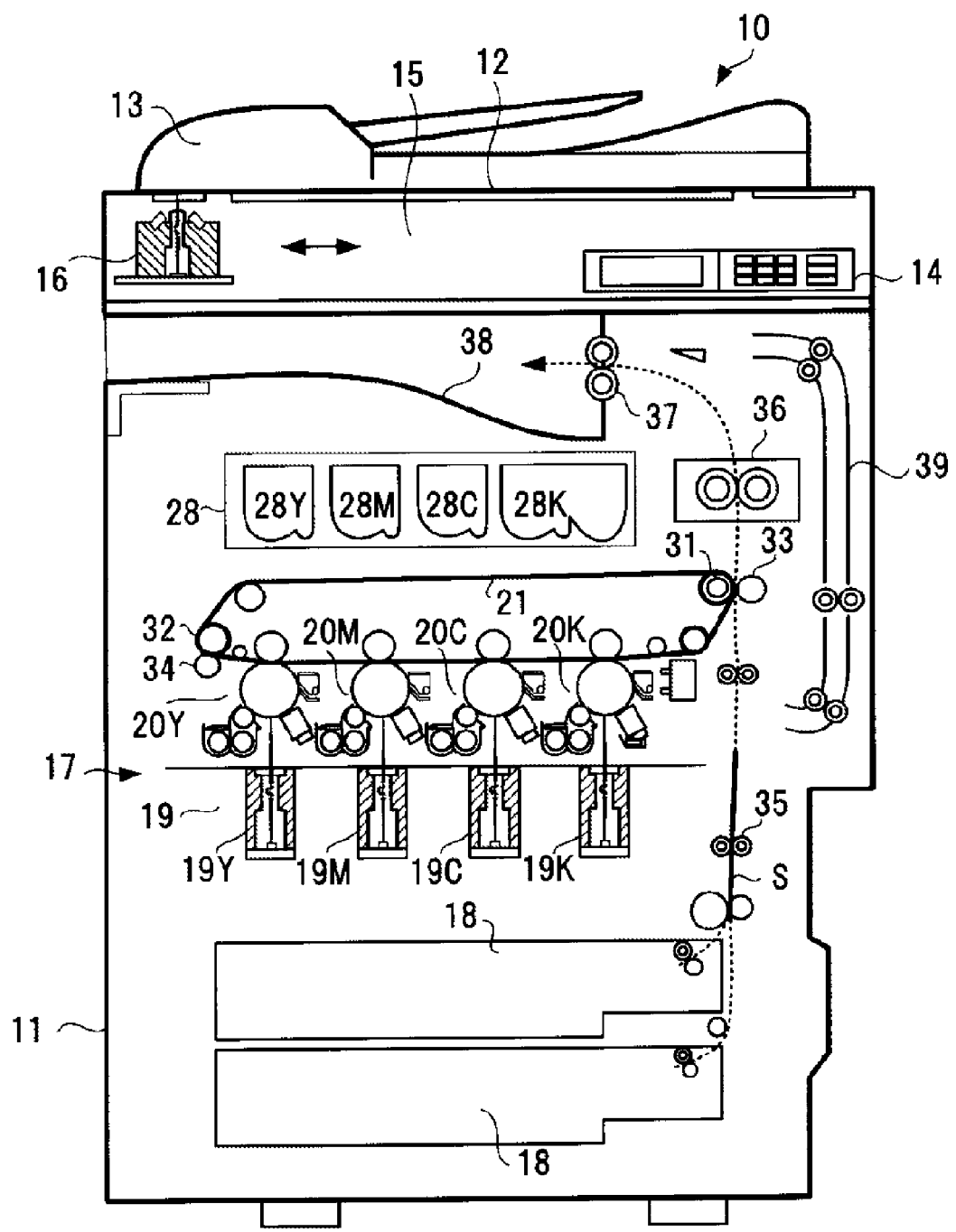
FIG. 1 is a diagram illustrating the configuration of an image forming apparatus according to an embodiment.

Embodiments provide an imaging device array which can be formed in a single molding operation to form a monolithic molded lens in order to prevent the misalignment of relative positions of the lens and the mirror, and an image forming apparatus that uses the imaging device array.

In general, according to one embodiment, an imaging device array includes a plurality of imaging devices including an incidence surface that converges light in the primary scanning direction, and plural reflective surfaces that reflect light from the incidence surface, and an exit surface that outputs light that has been reflected by the plural reflective surfaces. At least one of the plural reflective surfaces is formed on the apex of a protrusion that protrudes outwardly from the body of the lens, and the light that is output from the exit surface is imaged at an image point.

The embodiments of the present invention will be explained with reference to the figures. The same reference numeral and letters will be used to represent the same parts throughout the figures.

First Embodiment

FIG. 1 is a diagram illustrating the configuration of an image forming apparatus using an imaging device array according to an embodiment. In FIG. 1, an image forming apparatus 10 may be a multifunction peripheral (MFP), a printer, a copier or the like. In the following explanation, the MFP will be used as an example.

On top of a main body 11 of the MFP 10, there is a document table 12 made of a transparent glass. On the document table 12, an automatic document feeder (ADF) 13 is arranged in a freely opening/closing way, i.e., it may be hingedly connected to the main body such that it may be opened and closed along the hinge. An operation panel 14 is located in an upper portion of the main body 11. The operation panel 14 has various types of keys and a touch panel-type display section for selecting operations of the MFP 10.

Below the ADF 13 inside of the main body 11, a scanner 15, functioning as a reading apparatus, is positioned. The scanner 15 reads a document supplied by the ADF 13, or from a document set on the document table, to generate image data thereabout, and the scanner includes a close contact-type image sensor 16 (hereinafter to be referred to as the image sensor). The image sensor 16 is arranged in the primary scanning direction (the depth direction into/out of the page of FIG. 1).

When an image of the document positioned on the document table 12 is to be read, the image sensor 16 is moved along the underside of the document table 12 below the document to read the image of the document line by line (i.e., the image sensor moves incrementally, or continuously, to the left and right of the MFP depicted in FIG. 1. This operation is carried out for the entirety of the document, so that a single page of the document is read. On the other hand, when a document is supplied by the ADF 13 is read, the image sensor 16 is set at a fixed position (the position shown the FIG. 1), and the document is moved past the image sensor 16.

In addition, in the central portion of the main body 11, there is a printer section 17. In the lower portion of the main body 11, there are plural cassettes 18 for accommodating various sizes of sheets of paper. The printer section 17 has a photoreceptor drum and an optical scanning apparatus that has the photoreceptor drum exposed. The optical scanning apparatus has a scanning head 19 including an LED array as a light emitting device, and light rays emitted from the scanning head 19 scan a photoreceptor to generate an image.

The printer section 17 processes the image data read by the scanner 15 or image data formed by a PC (personal computer) or the like to form an image on a sheet of paper as a recording medium for the image. For example, the printer section 17 may be a color LED printer of a tandem system, including a yellow (Y) image forming section 20Y, a magenta (M) image forming section 20M, a cyan (C) image forming section 20C, and a black (K) image forming section 20K.

The image forming sections 20Y, 20M, 20C, and 20K are arranged below a middle transcribing belt 21 and side by side from the upstream side to the downstream side. Also, the scanning head 19 has plural scanning heads 19Y, 19M, 19C, and 19K corresponding to the image forming sections 20Y, 20M, 20C, and 20K, respectively.

Figure 2:
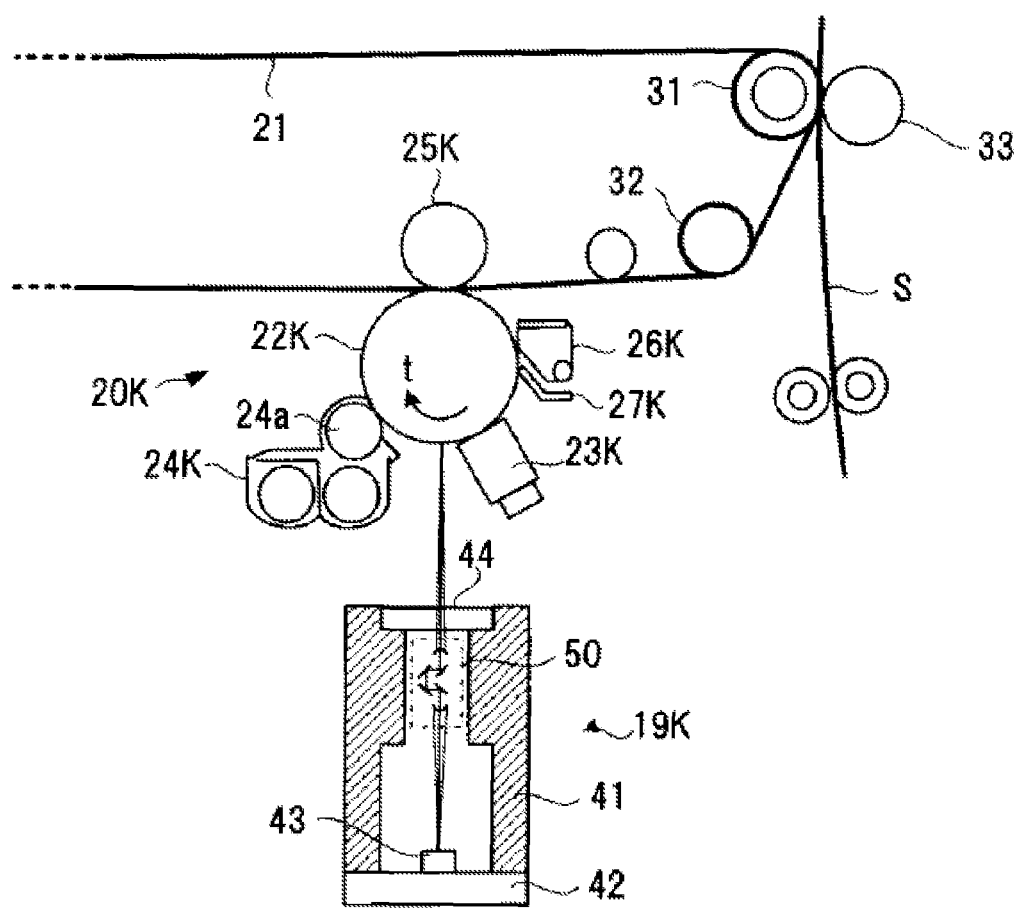
FIG. 2 is an enlarged view illustrating an image forming section according to an embodiment.

FIG. 2 is an enlarged view illustrating the configuration of the image forming section 20K among the image forming sections 20Y, 20M, 20C, and 20K. As the image forming sections 20Y, 20M, 20C, and 20K all have the same configuration, in the following explanation, only the image forming section 20K will be explained.

As shown in FIG. 2, the image forming section 20K has a photoreceptor drum 22K as an image carrier. On the periphery of the photoreceptor drum 22K, the following parts are arranged along a rotating direction t: a charger 23K, a developer 24K, a primary transcribing roller 25K, a cleaner 26K, a blade 27K, etc. The light from the scanning head 19K is irradiated on the exposure position of the photoreceptor drum 22K so that an electrostatic latent image is placed and then carried on the photoreceptor drum 22K.

The charger 23K of the image forming section 20K evenly charges the surface of the photoreceptor drum 22K. From the developer 24K, a 2-ingredient development agent containing a black toner and a carrier is supplied by a developing roller 24a, which is biased against the roller, to the photoreceptor drum 22K to form a toner image on the photoreceptor drum 22K. Then, the cleaner 26K uses the blade 27K to remove a residual toner left on the surface of the photoreceptor drum 22K after the image has been transferred to a printed medium, such as a paper sheet.

As shown in FIG. 1, above the image forming sections 20Y to 20K, a toner cartridge 28 is arranged for supplying toners to the developers 24Y to 24K. The toner cartridge 28 includes toner cartridges for the colors of yellow (Y), magenta (M), cyan (C) and black (K).

The middle transcribing belt 21 is configured to face and be in contact with the photoreceptor drums 22Y to 22K, and is engaged on a master roller 31 and a slave roller 32 to be driven to move in a circulatory way. As shown in FIG. 2, at the position of the middle transcribing belt 21 facing the photoreceptor drum 22K, a primary transcribing voltage is applied by the primary transcribing roller 25K, so that the toner image on the photoreceptor drum 22K is primarily transcribed onto the middle transcribing belt 21.

A secondary transcribing roller 33 is arranged facing the master roller 31, on which the middle transcribing belt 21 is engaged. When a sheet S passes between the master roller 31 and the secondary transcribing roller 33, a secondary transcribing voltage is applied by the secondary transcribing roller 33 on the sheet S. As a result, the toner image on the middle transcribing belt 21 is secondarily transcribed onto the sheet S. A belt cleaner 34 is arranged near the slave roller 32 for the middle transcribing belt 21.

As shown in FIG. 1, in the portion from the sheet feeding cassette 18 to the secondary transcribing roller 33, a conveying roller 35 is arranged for conveying the sheet S fetched from the sheet feeding cassette 18. In addition, a fixer 36 is arranged downstream from the secondary transcribing roller 33. A conveying roller 37 is arranged downstream from the fixer 36. The conveying roller 37 exhausts the sheet S to a sheet exhausting section 38. In addition, a flipping conveying path 39 is arranged downstream from the fixer 36. The flipping conveying path 39 flips the sheet S and guides the sheet in the direction towards the secondary transcribing roller 33, and the flipping conveying path is adopted in the case of duplex printing.

In the following, the configuration of the scanning head 19K in the optical scanning apparatus will be explained with reference to FIG. 2. Here, the scanning head 19K is set facing the photoreceptor drum 22K for exposing the photoreceptor drum 22K. The photoreceptor drum 22K is driven to rotate at a preset rotation velocity, and the drum's surface can accumulate an electric charge. As the light from the scanning head 19K is irradiated on the photoreceptor drum 22K for exposure, an electrostatic latent image is formed on the surface of the photoreceptor drum 22K.

The scanning head 19K has an imaging device array 50. The imaging device array 50 is supported by a holding member 41. On a bottom portion of the holding member 41, there is a supporting body (circuit board) 42. On the supporting body (circuit board) 42, LEDs 43 are arranged as the light emitting devices. Here, the LEDs 43 are arranged equidistantly in an almost linear configuration along the primary scanning direction (in and out of the page of FIG. 2). Also, on the supporting body (circuit board) 42, a substrate (not shown in the figure) including a driver IC for controlling the light emission of the LEDs 43 is arranged. The configuration of the imaging device array 50 will be explained in detail later.

The driver IC forms a controller. On the basis of the image data read with the scanner 15 or the image data generated with the PC or the like, the controller generates a control signal for the scanning head 19K. Corresponding to the control signal, the LEDs emit light with a prescribed light quantity. Then, the light rays emitted from the LEDs 43 are incident on the imaging device array 50. They pass through the imaging device array 50 and are imaged on the photoreceptor drum 22K. Thus, the image is formed on the photoreceptor drum 22K. A covering glass 44 is attached on the top (the exit side) of the scanning head 19K.

Figure 3:
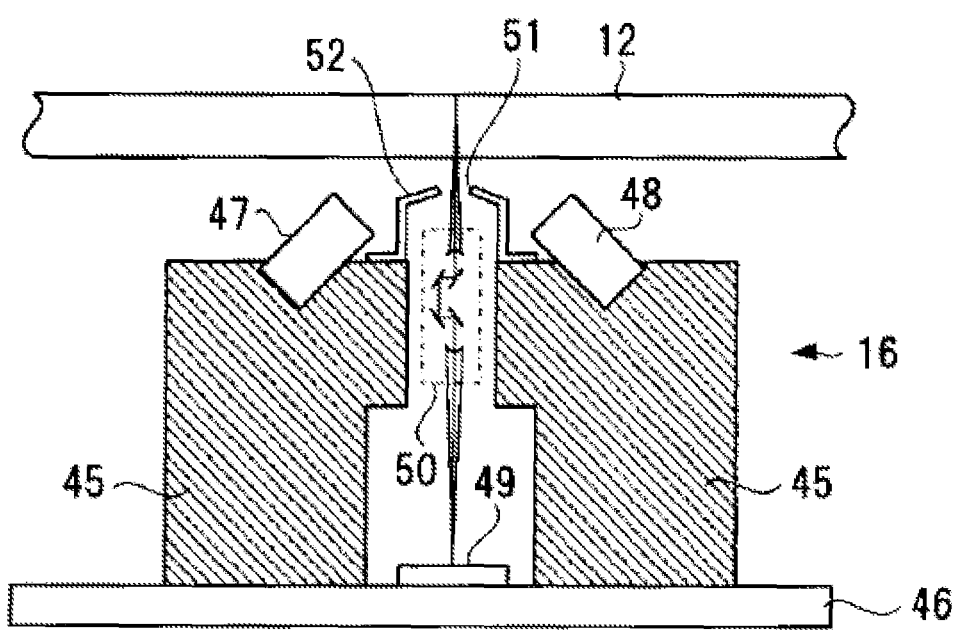
FIG. 3 is an enlarged view illustrating an image reading apparatus according to an embodiment.

FIG. 3 is a diagram illustrating the configuration of the image sensor 16 of the scanner 15 (the reading apparatus). According to the operation made on the operation panel 14, the image sensor 16 reads the image of the document carried on the document table 12 or the document supplied by the ADF 13. The image sensor 16 is a one-dimensional sensor arranged in the primary scanning direction (in and out of the page of FIG. 3). The image sensor is located within a case 45.

The case 45 is arranged on a substrate (circuit board) 46. On the upper surface of the document table 12 side of the case 45, two LED line illuminating apparatuses 47 and 48 that irradiate light in the direction of the document to be scanned are arranged to extend in the primary scanning direction (the depth direction of the page of the figure). The LED line illuminating apparatuses 47 and 48 have LEDs and light guiding members. Here, the light source is not limited to the LEDs. One may also adopt fluorescent lamps, xenon lamps, cold cathode tubes, organic ELs, etc.

Between the LED line illuminating apparatuses 47 and 48 in the upper portion of the case 45, the imaging device array 50 is supported. On the substrate (circuit board) 46 in the bottom portion of the case 45, a sensor 49 made of CCD, CMOS or the like is assembled. On top of the case 45, a light shielding member 52 having a slit 51 is attached.

The light emitted from the LED line illuminating apparatuses 47 and 48 and illuminated on the image reading position of the document on the document table 12 is reflected at the image reading position and is incident via the slit 51 on the imaging device array 50. The imaging device array 50 works as an upright one-to-one lens. The light incident on the imaging device array 50 exits the exit surface of the imaging device array 50 and is imaged on the sensor 49. That is, the light emitted from the LED line illuminating apparatuses 47 and 48 and reflected from the sheet being imaged passes through the imaging device array 50. The imaged light is converted by the sensor 49 to an electric signal, which is then sent to a memory section (not shown in the figure), on the substrate (circuit board) 46.

Figure 4:
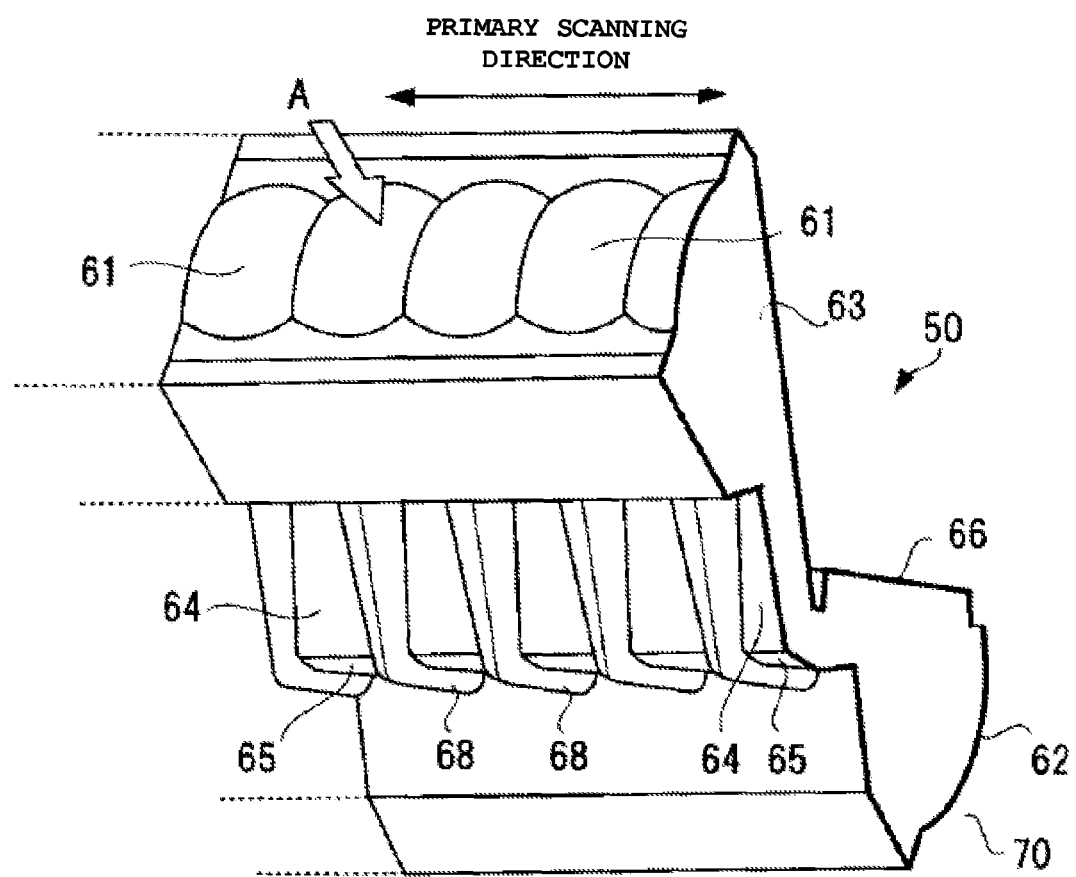
FIG. 4 is a perspective view illustrating an imaging device array according to a first embodiment as viewed from the incidence surface of light.

In the following, the configuration of an imaging device array 50 will be explained in more detail. FIG. 4 and FIG. 5 are diagrams illustrating the basic configuration of the imaging device array 50 according to the first embodiment. FIG. 4 is a perspective view of the imaging device array 50 as viewed from the incidence surface of light. FIG. 5 is a perspective view of the imaging device array 50 as viewed from the exit surface of light. Here, the incidence direction of light is indicated by an arrow A, and the outgoing direction of light is indicated by an arrow B.

The imaging device array 50 has plural imaging devices 70 each having a lens surface 61 as the incidence surface, a lens surface 62 as the exit surface, and reflective surfaces 63, 64, 65, and 66 that reflect the light incident from the lens surface 61 in plural rounds (4 rounds in the case shown in FIG. 4 and FIG. 5) to the lens surface 62. In the following, the reflective surfaces will be called mirror surfaces.

As shown in FIG. 4 and FIG. 5, the imaging device array 50 has plural imaging devices 70 arranged along the primary scanning direction, with their incidence surfaces and exit surfaces adjacent to each other. Here, the plural imaging devices 70 are monolithically formed of a molded resin or a glass. In the following explanation, the imaging device array 50 will be simply referred to as the array 50.

As shown in FIG. 4 and FIG. 5, the lens surface 61 is an asymmetric lens surface (the incidence surface) in the direction perpendicular to the primary scanning direction, and the lens surface 62 is an asymmetric lens surface (the exit surface) in the direction perpendicular to the primary scanning direction. In the following, the lens surface 61 may also be referred to as the incidence lens surface, while the lens surface 62 will be referred to as the exit lens surface.

Also, as shown in FIG. 4 and FIG. 5, the mirror surface 63 is a varying width mirror asymmetric in the direction perpendicular to the primary scanning direction. As can be seen in FIG. 5, the mirror surface is a tapered recess on the outer surface of the array 50. The mirror surface 64 is also a varying width mirror asymmetric in the direction perpendicular to the primary scanning direction. The mirror surface is a tapered recess on the outer surface of the array.

In addition, the mirror surface 65 is also a surface mirror of a mirror asymmetric in the direction perpendicular to the primary scanning direction, and the mirror surface is a tapered recess. The mirror surface 66 forms a reflective surface on a top portion of a protrusion 67 protruding outwardly from the body of the array 50 as viewed in the incidence direction of light. Here, the mirror surfaces 63, 64, and 65 are formed in a tapered shape to facilitate pulling the array 50 out of the dies in the molding operation of forming the array.

Also, the shape of the protrusion 67 is tapered in the height direction.

Figure 6B:
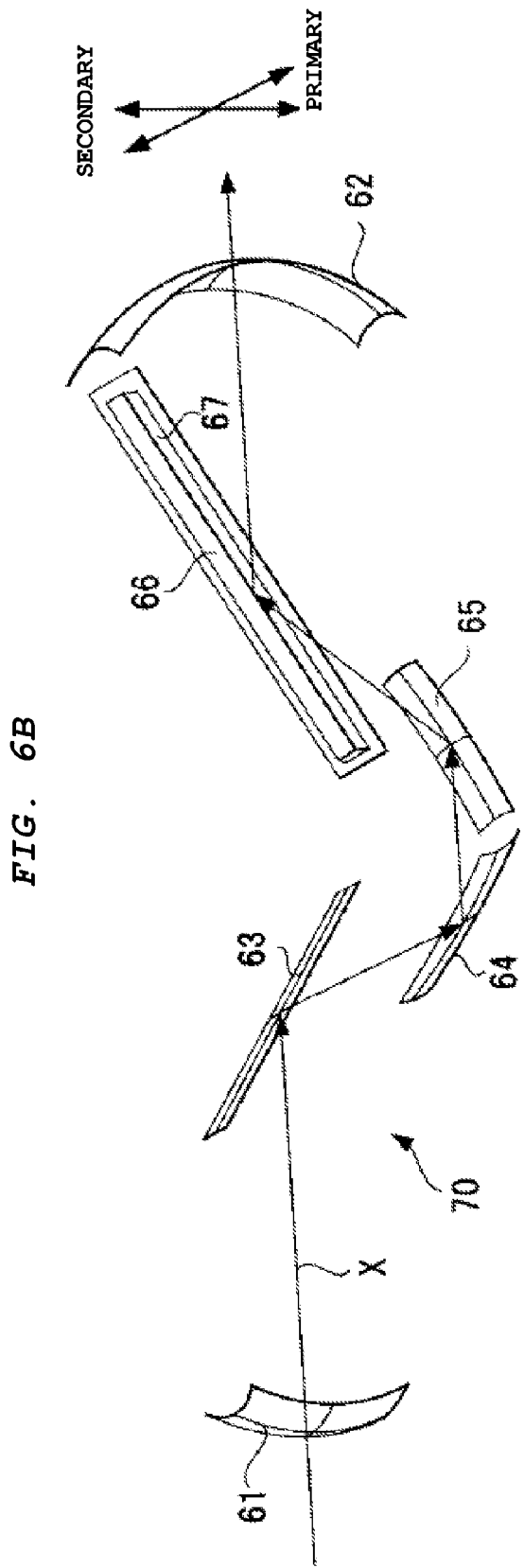

FIGS. 6A and 6B are schematic diagrams illustrating the configuration of the imaging device array 50 and the light passing and light reflecting surfaces thereof. FIG. 6A shows the imaging device array 50 as a combination of the plural imaging devices 70 each including the incidence lens surface 61, the mirror surfaces 63, 64, 65, and 66 and the exit lens surface 62. In FIG. 6A, the incidence lens surface 61, the mirror surfaces 63, 64, 65, and 66 and the exit lens surface 62 are shown separated from each other, i.e., the monolithic body on which they are formed is not shown. However, this is only for facilitating an understanding of the configuration of the imaging devices 70. In the practice, they are molded as a monolith from a glass or a resin.

FIG. 6B shows one set of the imaging devices 70 of FIG. 6B including the lens surface 61, the mirror surfaces 63, 64, 65, and 66, and the lens surface 62. The light rays condensed in one set of the imaging devices contribute to imaging. The light rays incident on the incidence lens surface 61 of the one set of the imaging devices 70 are called stray light when they are incident on the other sets of the imaging devices and ultimately reach the imaging surface. This stray light are the light rays that degrade the imaging performance. As shown in FIG. 6B, the primary scanning direction is indicated by an arrow of "primary," while the secondary scanning direction is indicated by an arrow of "secondary." In the later diagrams, the "primary" arrow indicates the primary scanning direction, while the "secondary" arrow indicates the secondary scanning direction.

A light X (in FIG. 6B, only the central light ray of the optical path is shown) incident on the imaging device array 50 enters the lens surface 61, and the light is condensed in both the primary scanning direction and the secondary scanning direction. Among the light, the light rays contributing to imaging are incident on the mirror surface 63. The light rays incident on the mirror surface 63 are incident at the incidence angle that satisfies the total reflection condition, so that all of the light rays are reflected by the mirror surface 63; among them, the light rays contributing to imaging are incident on the mirror surface 64 at an incidence angle that satisfies the total reflection condition. All of the light rays incident on the mirror surface 64 are reflected, and, among them, the light rays contributing to the imaging form an inverted image, and they are then incident on the mirror surface 65 at the incidence angle that satisfies the total reflection condition. In addition, all of the light rays incident on the mirror surface 65 are reflected, and, among them, the light rays contributing to imaging are incident at the incidence angle that satisfies the total reflection condition on the mirror surface 66.

The mirror surface 66 is formed on the interior of the top portion of the outwardly extending protrusion 67. All of the light rays incident on the mirror surface 66 are reflected, and, among them, the light rays contributing to imaging are guided to the exit lens surface 62, are re-imaged by the lens surface 62, and are formed as an equal-magnification erect image (of the original image) on an image plane. The image plane corresponds to the sensor 49 and the photoreceptor drum 22.

As can be seen from FIG. 4 and FIG. 5, the array 50 has the mirror surfaces 63, 64, 65, and 66 by which the incident light rays sequentially reflected and guided to the lens surface 62. They are arranged alternately side by side in the primary scanning direction with portions that guide the incident light rays out of the mirror surfaces, that guide the incident light rays to the portions so that they are not finally incident on the image plane, or that guide the incident light rays to the light shielding section of the array 50.

That is, the surfaces (the propagating stopping surfaces) that stop the light other than that reflected by the mirror surfaces 63, 64, 65, and 66 from propagating to the lens surface 62 are arranged on the sides of each of the mirror surfaces 63, 64, 65, and 66. In FIG. 4 and FIG. 5, portions corresponding to protrusions 68 on the sides of the mirror surfaces 64 and 65, protrusions 69 on the sides of the mirror surface 63, and a wall of the protrusion 67 that has the mirror surface 66 forming the outermost surface or top thereof become the propagation stopping surfaces.

FIG. 7 to FIG. 12 illustrate the state of the propagation of the light rays on the various lens surfaces and the mirror surfaces. In FIG. 7 to FIG. 12, an arrow A indicates the propagating direction of the light ray X.

Figure 7A:
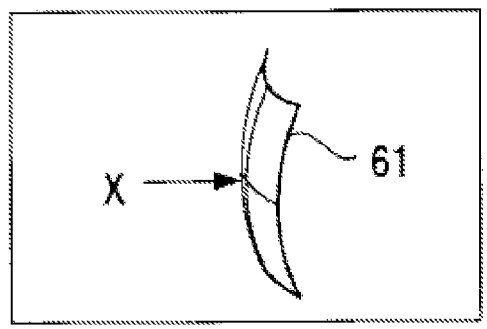
FIGS. 7A to 7C are diagrams illustrating the propagation state of light rays on a lens surface in the first embodiment.
Figure 7B:
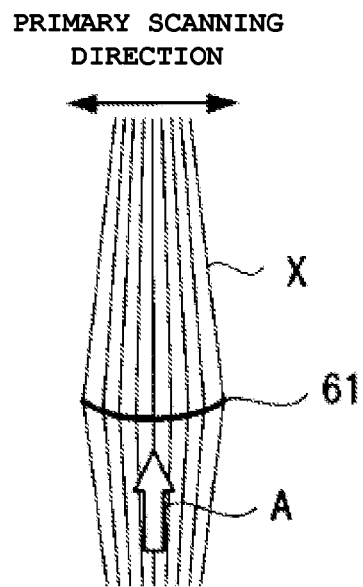
Figure 7C:
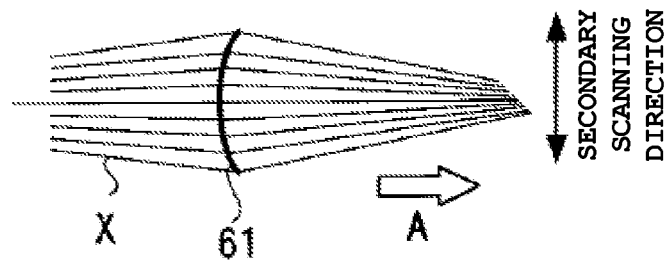

FIG. 7A is a diagram illustrating the incidence direction of a light ray X to the lens surface 61. FIG. 7B is a diagram illustrating the lens surface 61 as viewed from the secondary scanning direction. FIG. 7C is a diagram illustrating the lens surface 61 as viewed in the primary scanning direction. The lens surface 61 forms the lens surface (the incident surface) asymmetric in the direction perpendicular to the primary scanning direction, and the boundary between the adjacent imaging devices forms the edge thereof. Consequently, it is possible to minimize the blocked incident light and to increase the optical efficiency.

As shown in FIG. 7B and FIG. 7C, the incident light ray X becomes a condensed light beam in both the primary scanning direction and the secondary scanning direction. The light rays emitted from an object point at a prescribed height of the object are condensed on the middle of one set of the imaging devices 70, and mirror surface 63 (in FIG. 8) and mirror surface (in FIG. 9) have has positive power in primary scanning direction and secondary scanning direction to make the light rays play the role in increasing the light quantity contributing to the imaging. The shape of the lens surface 61 is asymmetric in the direction perpendicular to the primary scanning direction, so that the various types of aberration generated due to the incidence of a light ray oblique to the mirror surface can be canceled.

Figure 8A:
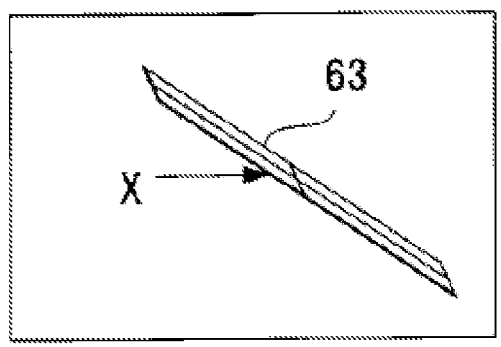
FIGS. 8A to 8D are diagrams illustrating the propagation state of light rays on a mirror surface in the first embodiment.
Figure 8B:
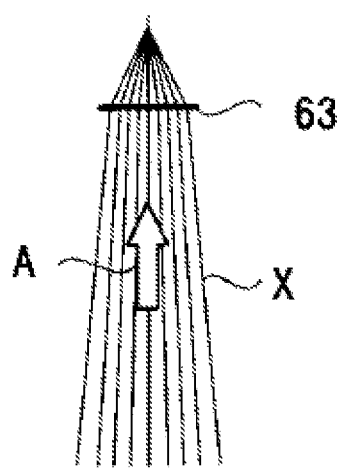
Figure 8C:
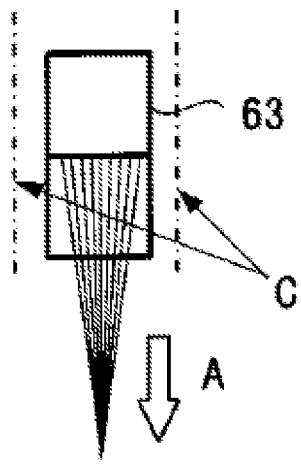
Figure 8D:
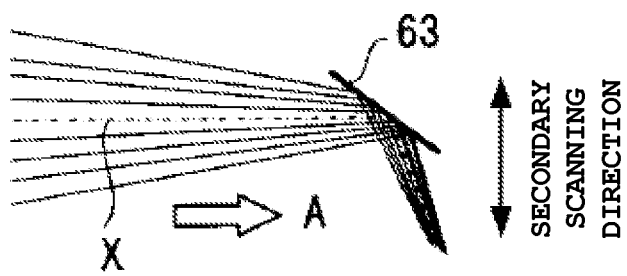

FIG. 8A is a diagram illustrating the incidence of the light ray X onto the mirror surface 63. FIG. 8B is a diagram illustrating the mirror surface 63 as viewed in the secondary scanning direction. FIG. 8C is a diagram illustrating the mirror surface 63 as viewed in the incidence direction of the light. FIG. 8D is a diagram illustrating the mirror surface 63 as viewed in the primary scanning direction.

The mirror surface 63 is a mirror surface asymmetric in the direction perpendicular to the primary scanning direction, and the mirror surface guides the light rays to the next mirror surface 64. In FIG. 8C, a dotted-dashed line C indicates the boundary surface between the adjacent imaging devices 70, i.e., a similar or nearly identical mirror is located symmetrically to the mirror surface 63 to the right and the left (unless the mirror surface 63 is at the end of the array) of the dashed dotted line, in the primary scanning direction. The portion between the mirror surface 63 and the boundary surface C form propagation stopping surfaces. The light rays incident on this region are guided (reflected or ultimately reflected by multiple reflective surfaces in the array 50) to the light shielding section or to a location out of the image plane of the sensor surface, the photoreceptor drum, etc.

As shown in FIG. 8D, when the central light ray of the optical path is taken as the light ray X (the dotted-dashed line), the positions of the mirror surface 63 where the light rays are incident are different between the upper side and lower side of the light ray X. On the upper side, the mirror surface works on the upstream side of the optical path away from a middle image plane (indicated by a double-dotted-dashed line S in FIG. 17), while on the lower side, the mirror surface works on the downstream side of the optical path near the middle image plane S.

In order to maintain a smaller offset between the upper/lower portions of the light rays at the light focusing site, an absolute value of the power for the upper side portion is relatively smaller, while an absolute value of the power for the lower side portion is larger than that of the upper side portion as shown in FIG. 8D. For this purpose, the mirror surface 63 has a shape that is asymmetric in the direction perpendicular to the primary scanning direction.

Figure 9A:
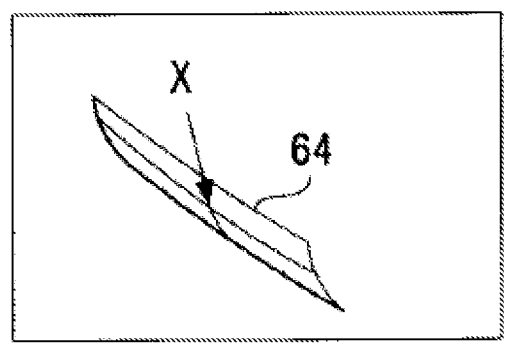
FIGS. 9A to 9D are diagrams illustrating the propagation state of light rays on another mirror surface in the first embodiment.
Figure 9B:
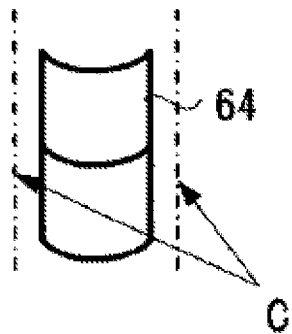
Figure 9C:
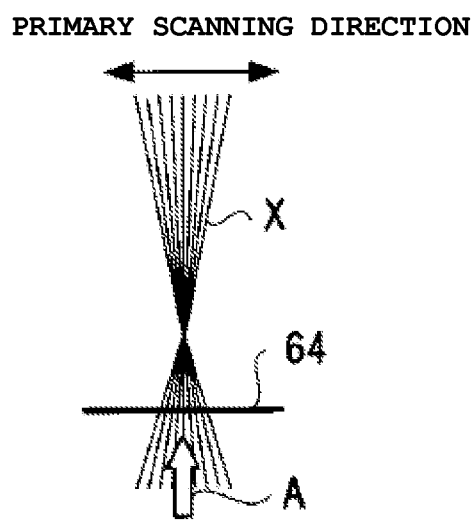
Figure 9D:
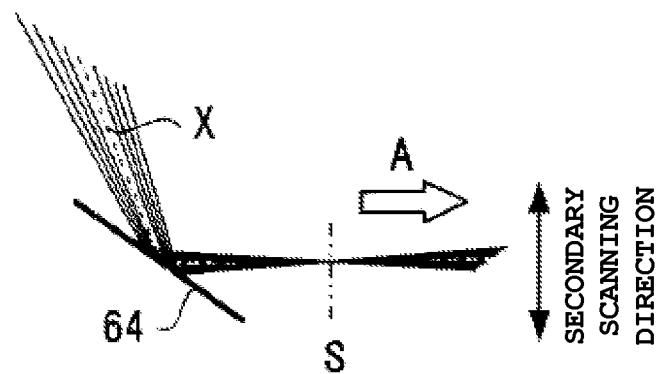

FIG. 9A is a diagram illustrating the incidence direction of the light ray X on the mirror surface 64. FIG. 9B is a diagram illustrating the mirror surface 64 as viewed in the light incidence direction. FIG. 9C is a diagram illustrating the mirror surface 64 as viewed from the secondary scanning direction. FIG. 9D is a diagram illustrating the mirror surface 64 as viewed from the primary scanning direction.

The mirror surface 64 guides the light rays to the next mirror surface 65. The dotted-dashed line C in FIG. 9B represents the boundary surface between the adjacent imaging devices 70. The portion between the mirror surface 64 and the boundary surface C becomes the propagation stopping surfaces described above. The light rays incident on this region are finally guided to the light shielding section or to a location other than the image plane of the sensor surface, the photoreceptor drum, etc. As shown in FIG. 9D, when the central light ray of the optical path is taken as the light ray X (the dotted-dashed line), the sites on the mirror surface 64 where the light rays are incident are different between the upper side and the lower side of the central light ray X. On the upper side, the mirror surface works on the upstream side of the optical path away from the middle image plane S; on the lower side, the mirror surface works on the downstream side of the optical path near the middle image plane S.

In order to guarantee a smaller offset between the upper/lower portions of the light rays at the light focusing site, as shown in FIG. 9D, an absolute value of the power for the upper side portion is relatively smaller, while an absolute value of the power for the lower side portion is larger than that of the upper side portion. For this purpose, the mirror surface 64 has a shape that is asymmetric in the direction perpendicular to the primary scanning direction.

Figure 10A:
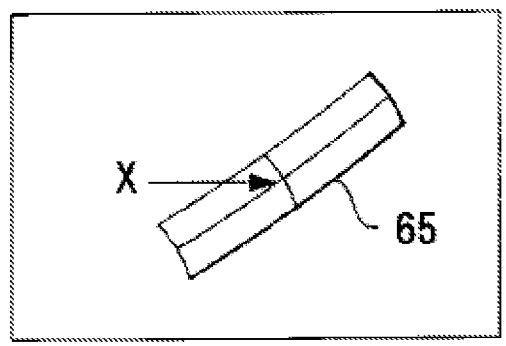
FIGS. 10A to 10D are diagrams illustrating the propagation state of light rays on another mirror surface in the first embodiment.
Figure 10B:
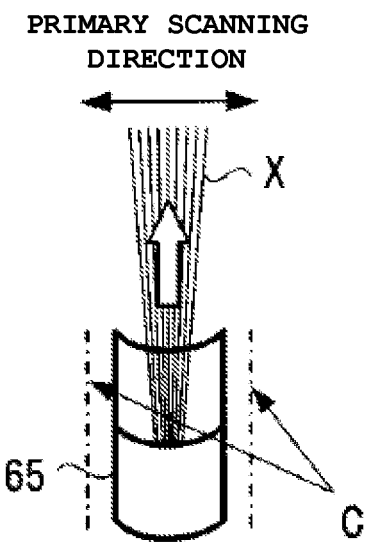
Figure 10C:
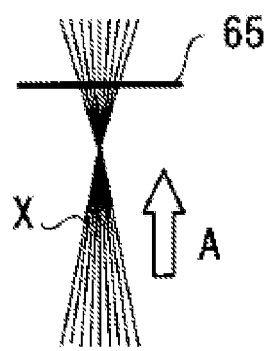
Figure 10D:
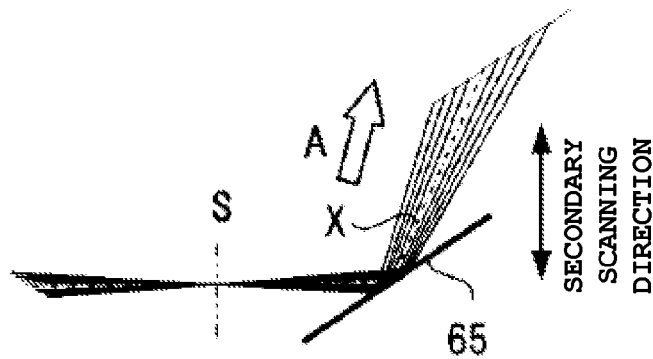

FIG. 10A is a diagram illustrating the incidence direction of the light ray X on the mirror surface 65. FIG. 10B is a diagram illustrating the mirror surface 65 as viewed in the light incidence direction. FIG. 10C is a diagram illustrating the mirror surface 65 as viewed from the secondary scanning direction. FIG. 10D is a diagram illustrating the mirror surface 65 as viewed from the primary scanning direction.

The mirror surface 65 guides the light rays to the next mirror surface 66. In FIG. 10B, the dotted-dashed line C represents the boundary surface between the adjacent imaging devices 70. The portion between the mirror surface 65 and the boundary surface C becomes the propagation stopping surfaces described above. The light rays incident on this region are finally guided to the light shielding section or to a location other than the image plane of the sensor surface, the photoreceptor drum, etc.

In FIG. 10D, the central light ray of the optical path is taken as the light ray X (the dotted-dashed line). In this case, the positions of the mirror surface 65 where the light rays are incident are different between the upper side and lower side of the light ray X. On the upper side, the mirror surface works on the upstream side of the optical path away from the middle image plane S, while on the lower side, the mirror surface works on the downstream side of the optical path near the middle image plane S.

In order to ensure or maintain a smaller offset between the upper/lower portions of the light rays at the light focusing site, an absolute value of the power for the upper side portion of FIG. 10D is relatively smaller, while an absolute value of the power for the lower side portion of the mirror surface 65 is larger than that of the upper side portion thereof. Opposite to the mirror surface 64, the distance from the inverted image is shorter on the upstream side of the optical path, and the distance is longer on the downstream side of the optical path. Because the absolute value of the power should be larger for shorter distance from the inverted image, the relationship for the absolute values of the relative power is opposite to that for the mirror surface 64. Consequently, the mirror surface 65 has an asymmetric shape in the direction perpendicular to the primary scanning direction.

Figure 11A:
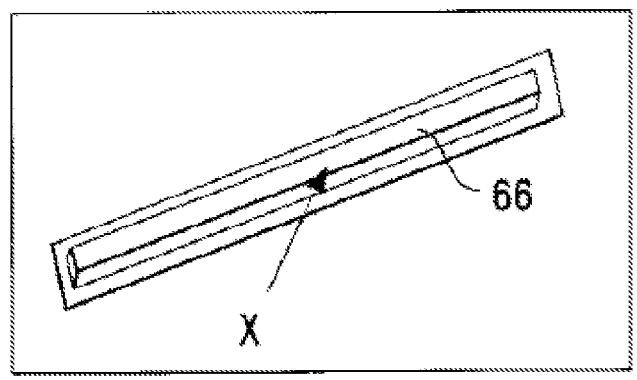
FIGS. 11A to 11D are diagrams illustrating the propagation state of light rays on another mirror surface in the first embodiment.
Figure 11B:
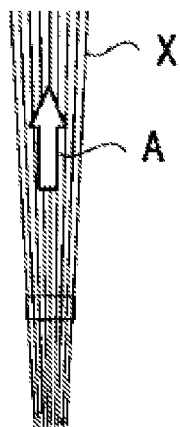
Figure 11C:
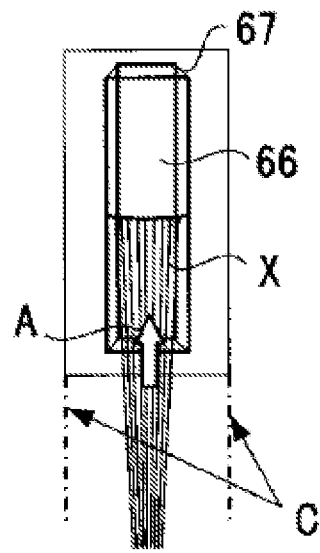
Figure 11D:
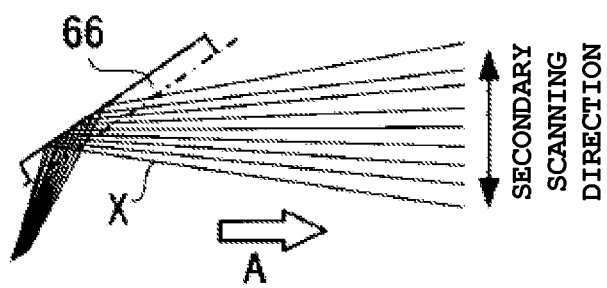

FIG. 11A is a diagram illustrating the incidence direction of the light ray X on the mirror surface 66. In this case, the light is incident from the lower side of the mirror surface 66. FIG. 11B is a diagram illustrating the mirror surface 66 as viewed from the secondary scanning direction. FIG. 11C is a diagram illustrating the mirror surface 66 as viewed from the light incidence direction. FIG. 11D is a diagram illustrating the mirror surface 66 as viewed from the primary scanning direction.

The mirror surface 66 guides the light rays to the next exit lens surface 62. Here, the mirror surface 66 is formed on the top portion of the protrusion 67 protruding outwardly from the array 50. By reflection at the wall surface of the protrusion 67, the light rays with an angle at a prescribed angle or more with respect to the primary scanning direction are blocked. In FIG. 11C, the dotted-dashed line C indicates the boundary surface between the adjacent imaging devices 70, and the portion between the mirror surface 66 and the boundary surface C becomes the propagation stopping surfaces. The light rays incident on this region are finally guided to the light shielding section or a location other than the image plane of the sensor surface, the photoreceptor drum, etc.

Figure 12A:
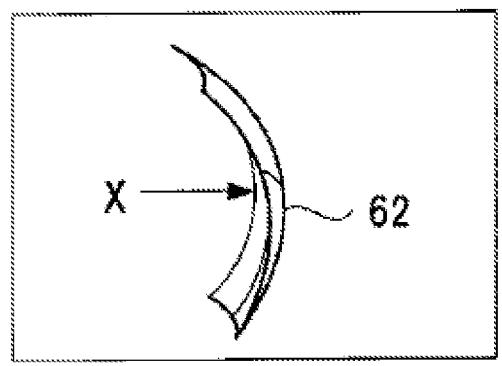
FIGS. 12A to 12C are diagrams illustrating the propagation state of light rays on another lens surface in the first embodiment.
Figure 12B:
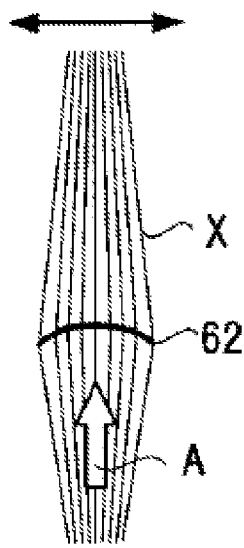
Figure 12C:
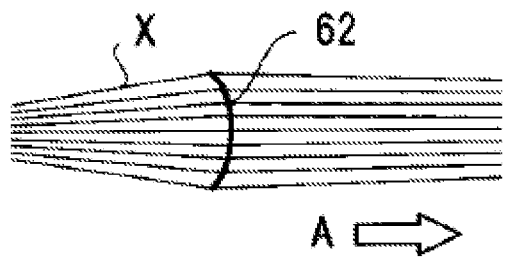

FIG. 12A shows the incidence direction of the light ray X on the lens surface 62. FIG. 12B is a diagram illustrating the lens surface 62 as viewed from the secondary scanning direction. FIG. 12C is a diagram illustrating the lens surface 62 as viewed in the primary scanning direction.

For the exit lens surface 62, the boundary between the adjacent imaging devices becomes the edge of the lenses. As shown in FIG. 12B and FIG. 12C, the light rays become the condensed light rays in both the primary scanning direction and the secondary scanning direction, so that the light is imaged on the image plane of the sensor 49, the photoreceptor drum 22 or the like. The shape of the lens surface 62 is asymmetric in the direction perpendicular to the primary scanning direction, so that the various aberrations caused by incidence of the light rays obliquely on the mirror surface of the preceding stage can be cancelled.

Figure 13:
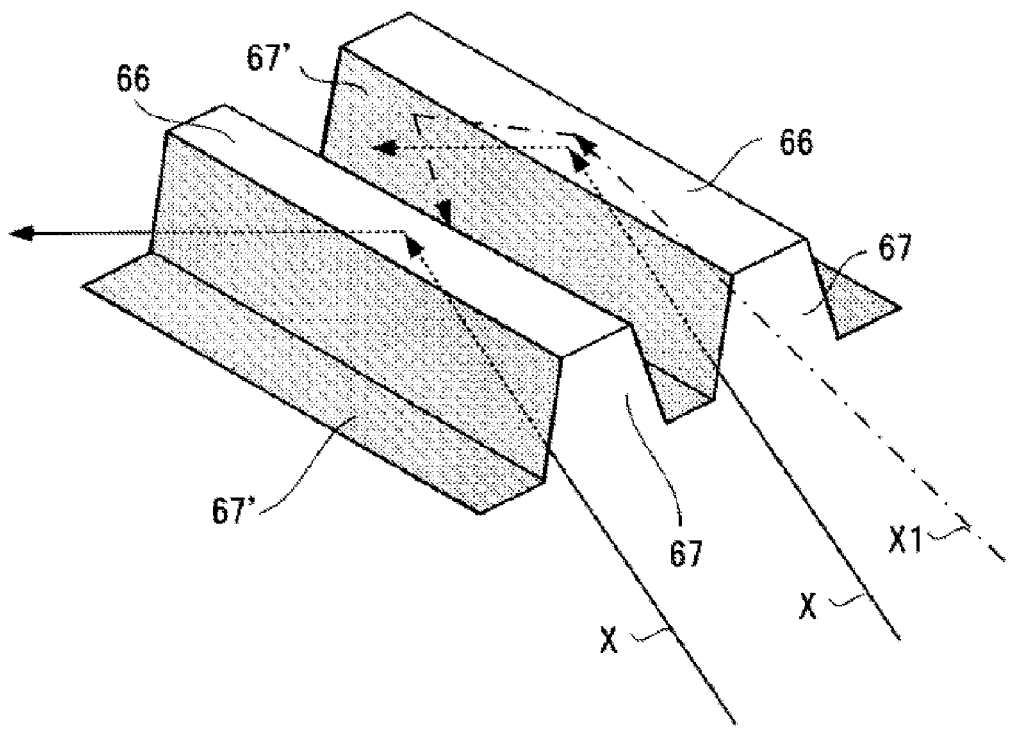
FIG. 13 is an enlarged perspective view illustrating a mirror surface in the first embodiment.
Figure 14:
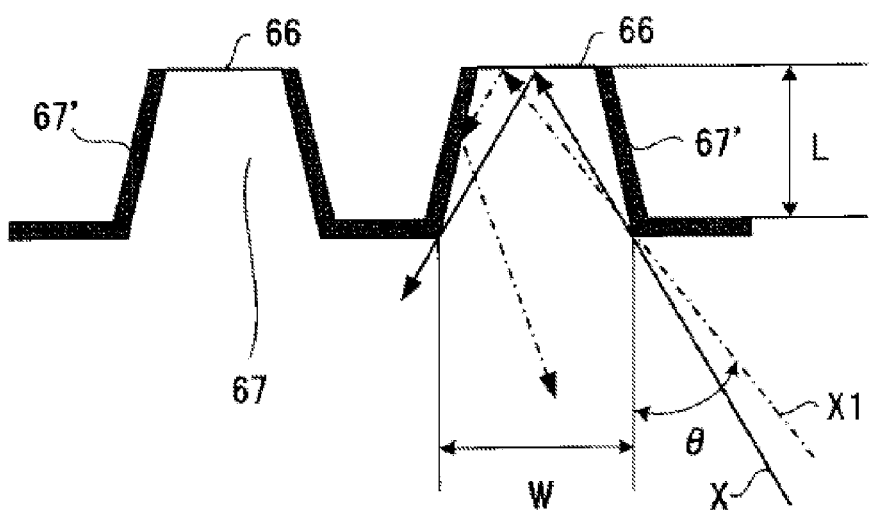
FIG. 14 is a cross-sectional view illustrating the mirror surface of FIG. 13.

The function of the wall of the protrusion 67 on the mirror surface 66 will be explained with reference to FIG. 13 and FIG. 14. FIG. 13 is an enlarged perspective view of the mirror surface 66. FIG. 14 is a cross-sectional view illustrating the mirror surface 66.

The mirror surface 66 is formed on the top portion of the protrusion 67. A light ray X directly incident on the mirror surface 66 is reflected by the mirror surface 66 and exits. On the other hand, the wall surface of the protrusion 67 has the function of shielding the light rays with a large absolute value of an angle θ in the primary scanning direction from the imaging plane. As shown in FIG. 13, the light rays X (the solid lines) at a prescribed angle of incidence in the primary scanning direction are totally reflected by the mirror surface 66 towards the next optical surface (lens surface 62). On the other hand, a light ray X1 (the dotted-dashed line) with a large absolute value of the incidence angle θ in the primary scanning direction is directed toward the wall surface of the protrusion 67 and is reflected by the wall surface of the protrusion 67; the light ray is finally guided to a region out of the image plane (the sensor 49 or the photoreceptor drum 22).

As shown in FIG. 14, the maximum value of the incidence angle θ in the primary scanning direction, θ, is determined by the following formula, where W represents a width of an inlet connected to the mirror surface 66 in the primary scanning direction and L represents a distance between the inlet and the mirror surface 66.

$$\tan|\theta| \leq W/2/L$$

Consequently, by determining the shape of the wall surface of the protrusion 67 on the basis of the above-listed formula, it is possible to prevent stray light from reaching the image plane and thus affecting the image quality. Also, a light shielding layer may be formed on the wall surface of the protrusion 67 and the adjacent wall surfaces. For example, the light shielding layer may be formed by coating a light shielding ink 67'. By coating the light shielding ink 67', it is possible to absorb the light that reaches the wall surface of the protrusion 67.

Figure 15A:
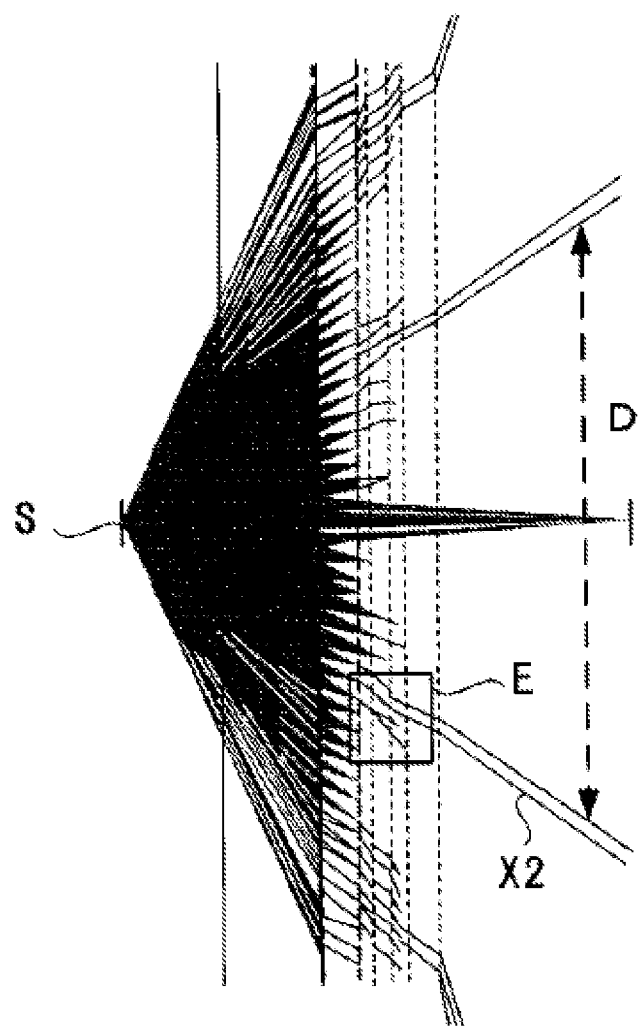
FIGS. 15A to 15C are diagrams illustrating the state of generating stray light corresponding to the presence/absence of a protrusion on the mirror surface of FIG. 13.

FIGS. 15A, B and C illustrate the state of generating stray light corresponding to the presence/absence of the protrusion 67. FIG. 15A shows the state of the light rays exiting from the mirror surface 66 when there is no protrusion 67. In FIG. 15A, the light from the middle image plane S is reflected by the mirror surface 66 to become the imaging light (the light used in imaging). In the imaging light, the stray light can be cut off outside of a certain range (the range indicated by an arrow D). However, the stray light cannot be cut off for the entire wide region.

Figure 15B:
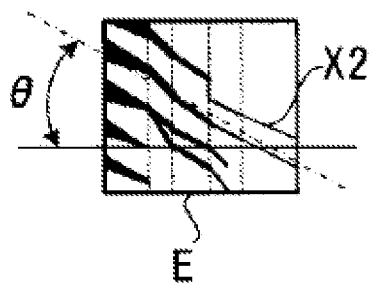

FIG. 15B is an enlarged view illustrating a stray light portion E of FIG. 15A out of the range indicated by arrow D. For a light ray X2 generated out of the range indicated by the arrow D, the light incident on each mirror surface or the light exiting from each mirror surface has the absolute value θ of the angle in the primary scanning direction as larger than that of the light rays used as the imaging light. That is, as the light rays with an absolute value of the angle in the primary scanning direction larger than the absolute value of the angle in the primary scanning direction of the light adopted as the imaging light are shielded at least at one site of the optical path, all of the stray light can be eliminated in the entire region.

Figure 15C:
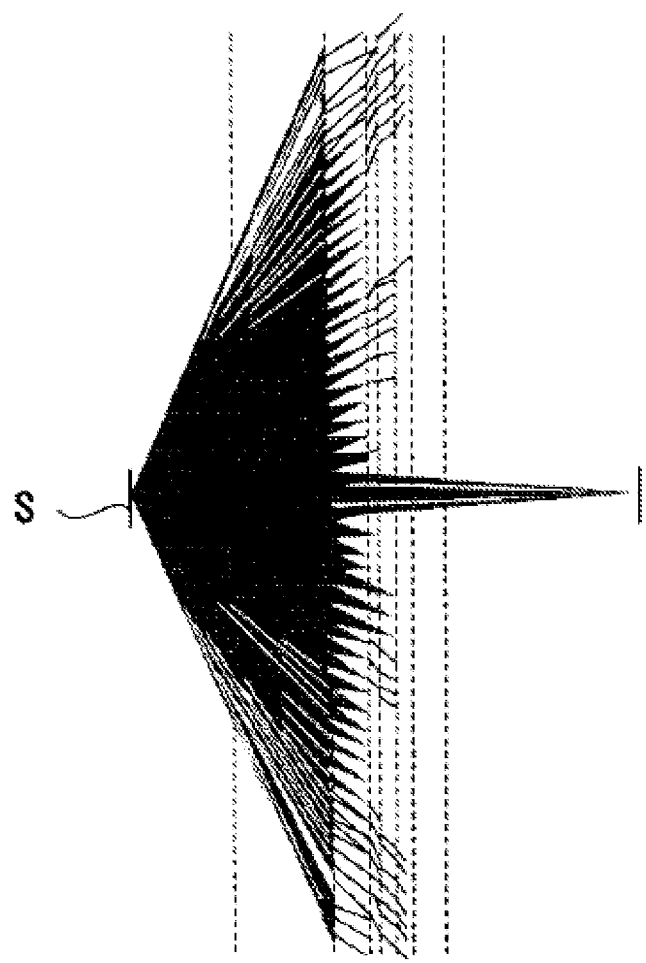

FIG. 15C is a diagram illustrating the pattern of the light rays exiting from the mirror surface 66 when the protrusion 67 is provided. As can be seen from FIG. 15C, by arranging the protrusion 67, a confirmation is made that the stray light has been eliminated.

Figure 16:
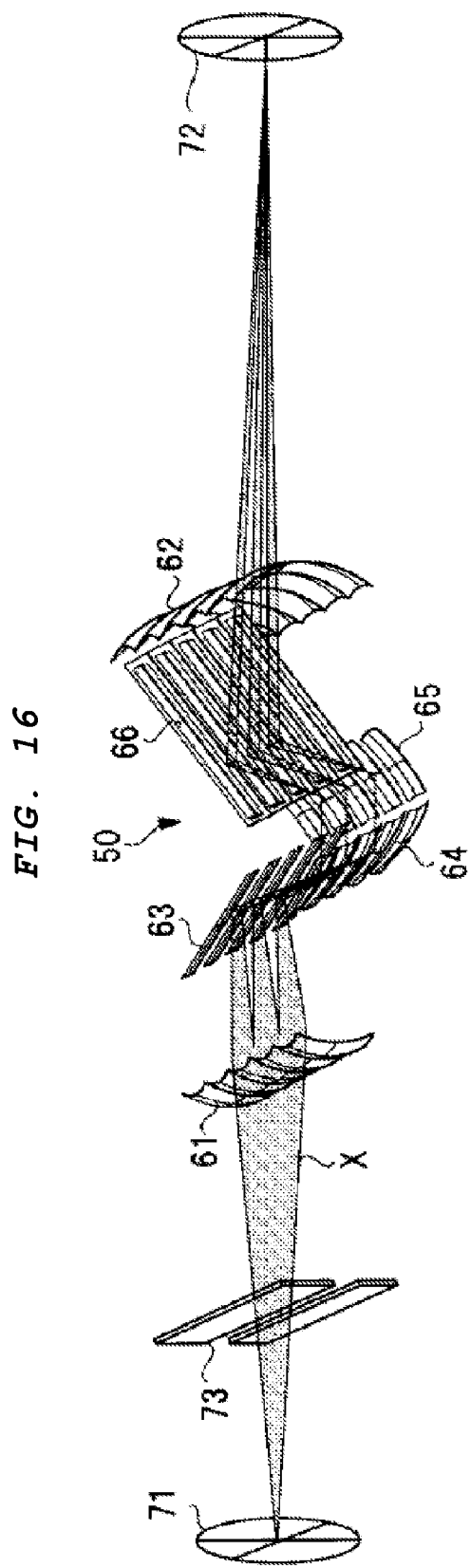
FIG. 16 is a perspective view illustrating the path of the light rays of the imaging device array according to the first embodiment.

FIG. 16 is a diagram illustrating the path of the light ray X of the imaging device array 50 arranged between an object plane 71 and an image plane 72. Between an object plane 71 and an imaging device array 50, a slit 73 for preventing the stray light is arranged. The light from the object plane 71 (the LEDs 43 or the document carrying plane of the document table 12) passes through the slit 73; the light is then incident on the lens surface 61 of the array 50, is reflected by the mirror surfaces 63, 64, 65, and 66, exits from the lens surface 62 and is imaged on the image plane 72 (the photoreceptor drum 22 or the sensor 49).

Figure 17:
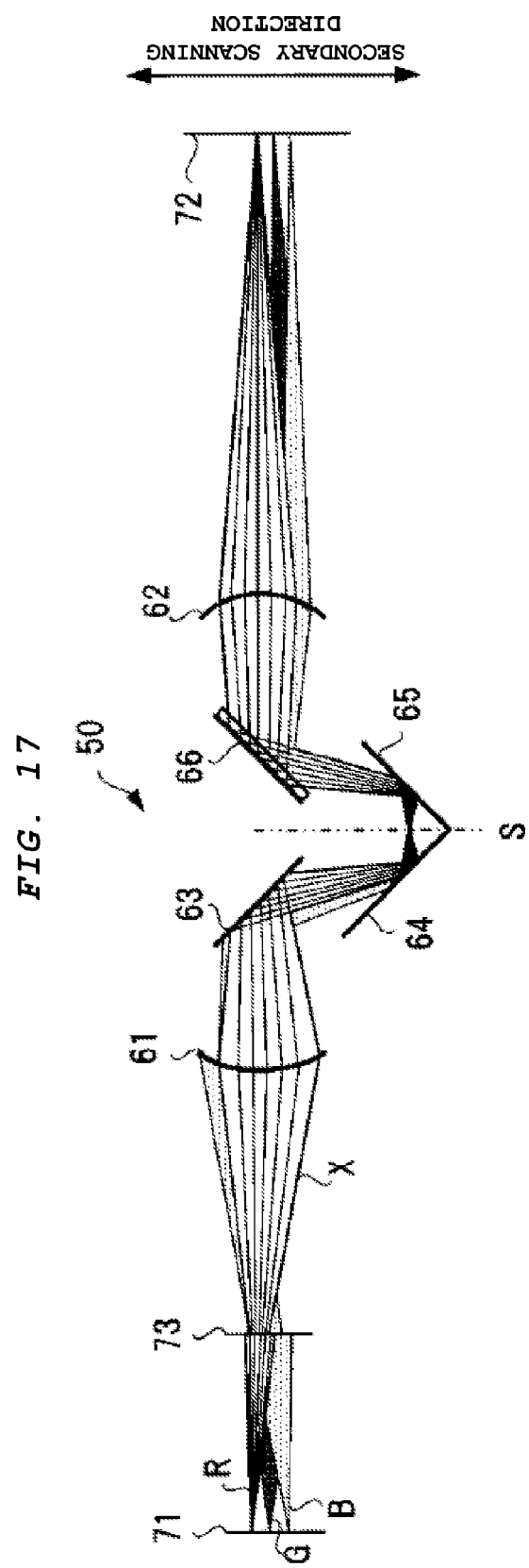
FIG. 17 is a diagram illustrating an optical path of the imaging device array according to the first embodiment as viewed in the primary scanning direction.
Figure 18:
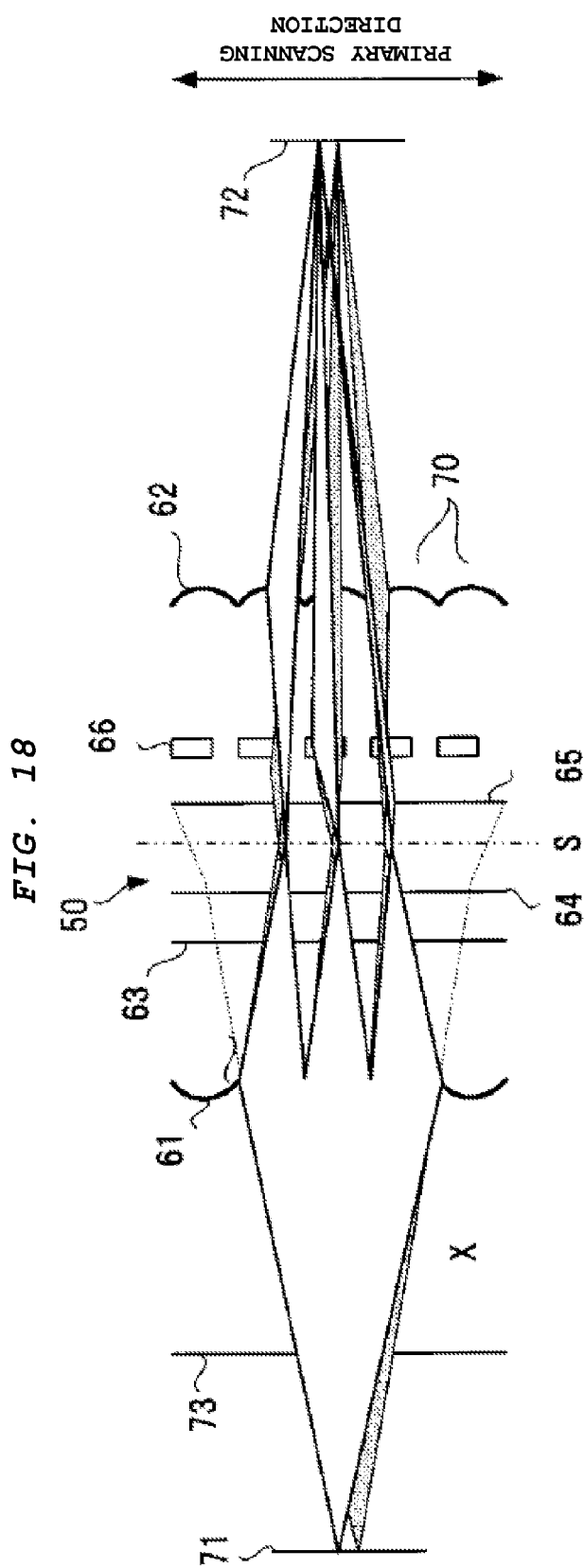
FIG. 18 is a diagram illustrating the optical path of the imaging device array according to the first embodiment as viewed in the secondary scanning direction.

FIG. 17 is a diagram illustrating the optical path of the array 50 as viewed looking in the primary scanning direction. FIG. 18 is a diagram illustrating the optical path of the array 50 as viewed looking in the secondary scanning direction.

As can be seen from FIG. 17, with respect to the primary scanning direction, light beams (such as beams R, G, and B originating at corresponding red, green and blue colored locations on the original image) from the object plane 71 pass through the slit 73 and are incident on the lens surface 61, so that an inverted image is formed near the middle side (S) of the array 50, and the inverted image is inverted again to form an upright image on the image plane 72. Also, as can be seen from FIG. 18, with respect to the secondary scanning direction, the light passing through the plural sets of the imaging devices 70 is focused at a single point on the image plane 72.

As explained above, the surfaces other than the mirror surface 66, that is, the lens surfaces 61 and 62 and the mirror surfaces 63, 64, and 65 each have an asymmetric shape in the direction perpendicular to the primary scanning direction, so that it is possible to correct for the curving of the image plane and coma aberration.

Figure 19:
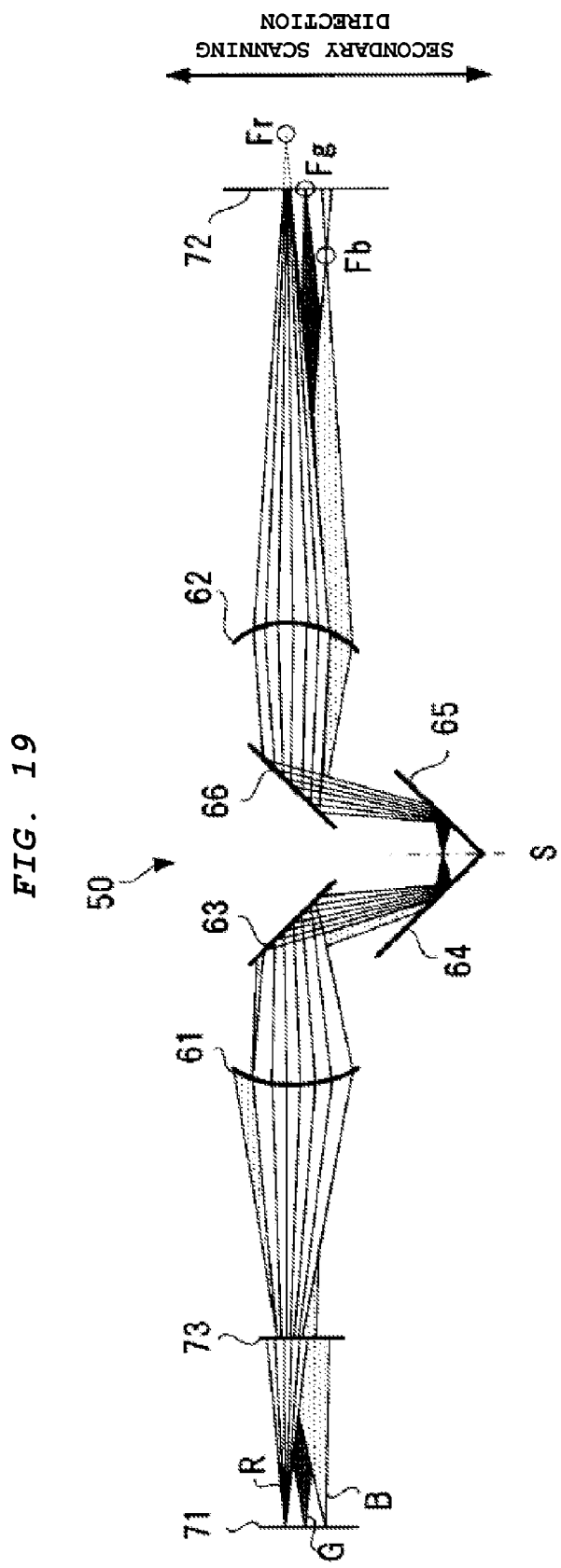
FIG. 19 is a diagram illustrating the light focusing state when an asymmetric item of the imaging device array according to the first embodiment is removed.

FIG. 19 is a diagram illustrating the light focusing state when the asymmetric profile of the array 50 including the lens surfaces 61 and 62 and the mirror surfaces 63, 64, 65, and 66 are all eliminated (that is, when the lens and mirror surfaces all have a shape symmetric in the direction perpendicular to the primary scanning direction) as viewed looking in the primary scanning direction. When the asymmetric profiles are eliminated, the defocusing quantity of the light beams (such as R, G, and B) varies corresponding to the position of the secondary scanning direction. That is, their focused positions Fr, Fg, and Fb are different from each other. Consequently, focusing can be carried out only in a narrow range. When the focusing precision is not required to be high, the embodiment shown in FIG. 19 may also be adopted.

In the first embodiment, the mirror surface 66 having the protrusion 67 is a flat plane. However, the mirror surface 66 may also be a surface with a certain power (a surface with a curvature).

Also, the mirror surface 66 is arranged right before the exit lens surface 62; among the mirror surfaces 63, 64, 65, and 66, the mirror surface 66 with the highest light shielding performance is arranged on the most downstream side, so that among the stray light generated on the upstream side, the light with an angle of the absolute value θ or more is entirely removed. In addition, as shown in FIG. 14, the light shielding layer (the light shielding ink 67') is applied on the wall surface of the protrusion 67 so that the effect of removing the stray light becoming more significant is realized.

Second Embodiment

Figure 20A:
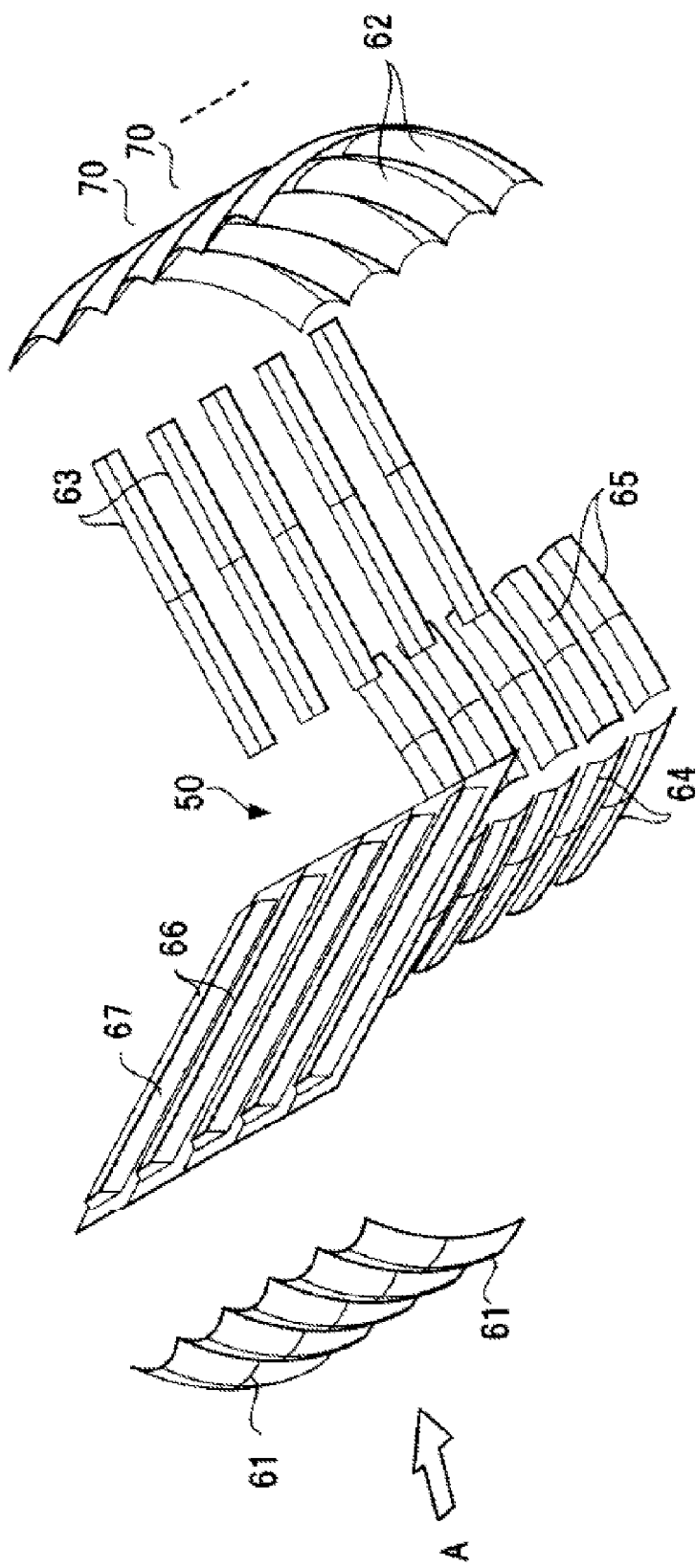
FIGS. 20A and 20B are diagrams illustrating the configuration of an imaging device array according to a second embodiment.

FIG. 20 is a diagram illustrating the configuration of the imaging device array 50 according to the second embodiment. As shown in FIG. 20A, according to the second embodiment, the mirror surface 66 having the protrusion 67 is arranged next to the incidence lens surface 61, and the mirror surface 63 is arranged in front of the exit lens surface 62 of the lenses 70. The remaining features are the same as those in the first embodiment.

Figure 20B:
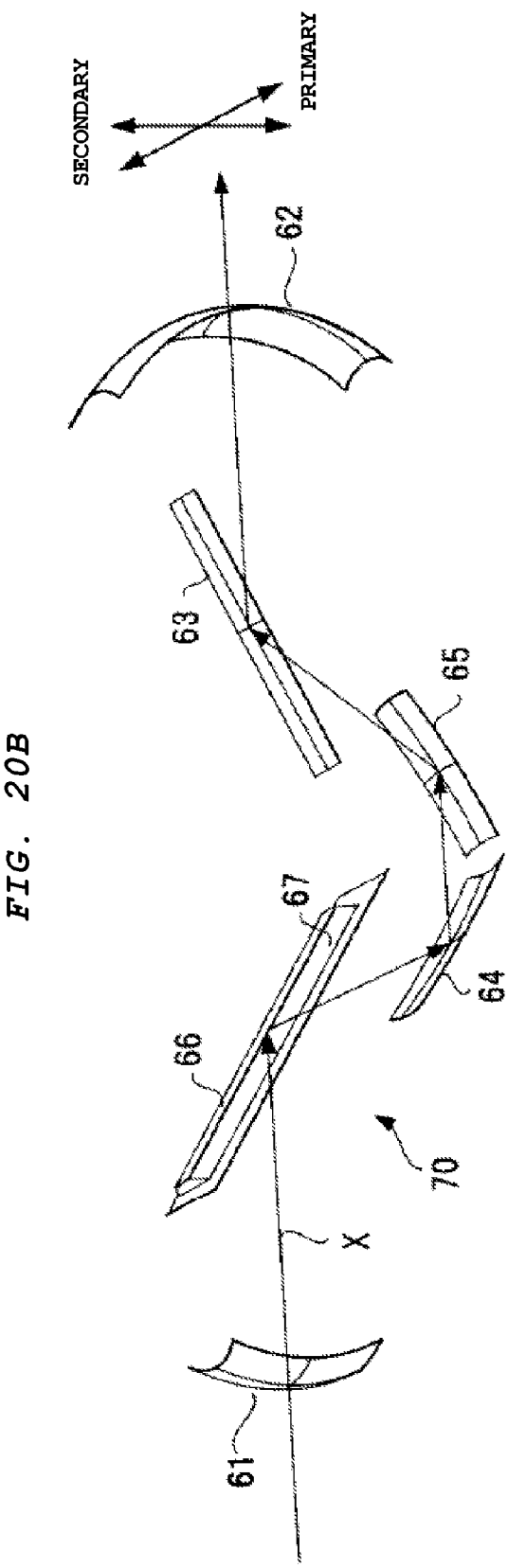

In this embodiment, as shown in FIG. 20B, the light X incident on the imaging devices 70 enters the lens surface 61 (the incidence surface), and the light is condensed in both the primary scanning direction and the secondary scanning direction. Among the light rays, the light rays contributing to the imaging are incident on the mirror surface 66. The mirror surface 66 is formed on the top portion of the protrusion 67 protruding outward. All of the light rays incident on the mirror surface 66 are reflected, and, among the light rays, the light rays contributing to the imaging are incident on the mirror surface 64.

The light rays incident on the mirror surface 64 are reflected; among these light rays, the light rays contributing to the imaging form an inverted image, and the light is then incident on the mirror surface 65. Then, the light rays incident on the mirror surface 65 are reflected, and, among these light rays, the light rays contributing to imaging are incident on the mirror surface 63. Among the light rays incident on the mirror surface 63, the light rays contributing to imaging are guided to the lens surface 62 (the exit surface), and the light rays are re-imaged by the lens surface 62 to form an equal-magnification erect image on the image plane.

The angle of the light rays in the primary scanning direction that passed through only the lens surface 61 increases monotonically as the distance in the primary scanning direction from the object plane is increased. Consequently, by arranging the mirror surface 66 having the protrusion 67 directly behind the lens surface 61, it is possible to eliminate the undesirable light rays immediately upon their contact with the incidence lens surface 61. Here, as the undesirable (stray) light rays are eliminated on the upstream side of the mirror surfaces of the array 50, the shapes of the light shielding portions (the propagating stopping surfaces) between the various mirrors on the downstream side can be simplified, and the shape of the dies for molding the array 50 can be simplified.

However, shielding all of the stray light with a large angle is difficult when the stray light is generated on the downstream side from the mirror surface 66, so that the edges of the mirror surfaces 64, 65, and 63 should be formed to have a sharp shape which has no rough face or fillet causing the diffused stray light.

Figure 21:
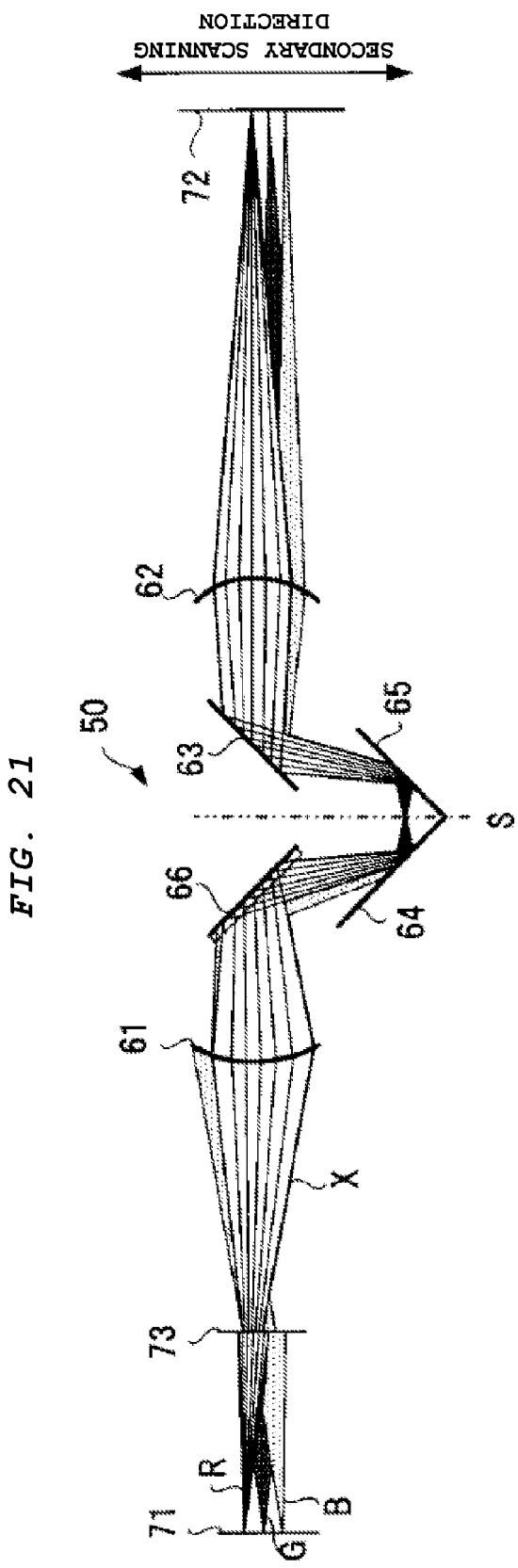
FIG. 21 is a diagram illustrating the optical path of the imaging device array according to the second embodiment as viewed in the primary scanning direction.

FIG. 21 is a diagram illustrating the optical path of the array 50 shown in FIG. 20 as viewed in the primary scanning direction. FIG. 22 is a diagram illustrating the optical path of the array 50 as viewed in the secondary scanning direction. As can be seen from FIG. 21, with respect to the primary scanning direction, the light beams (such as R, G, and B) from the object plane 71 pass through the slit 73 and incident on the lens surface 61 so that an inverted image is formed near the middle (S) of the array 50. By inverting the inverted image again, an upright image is formed on the image plane 72. Also, as can be seen from FIG. 22, with respect to the primary scanning direction, the light passed through the plural sets of the imaging devices 70 is focused at a single point on the image plane 72.

Figure 23A:
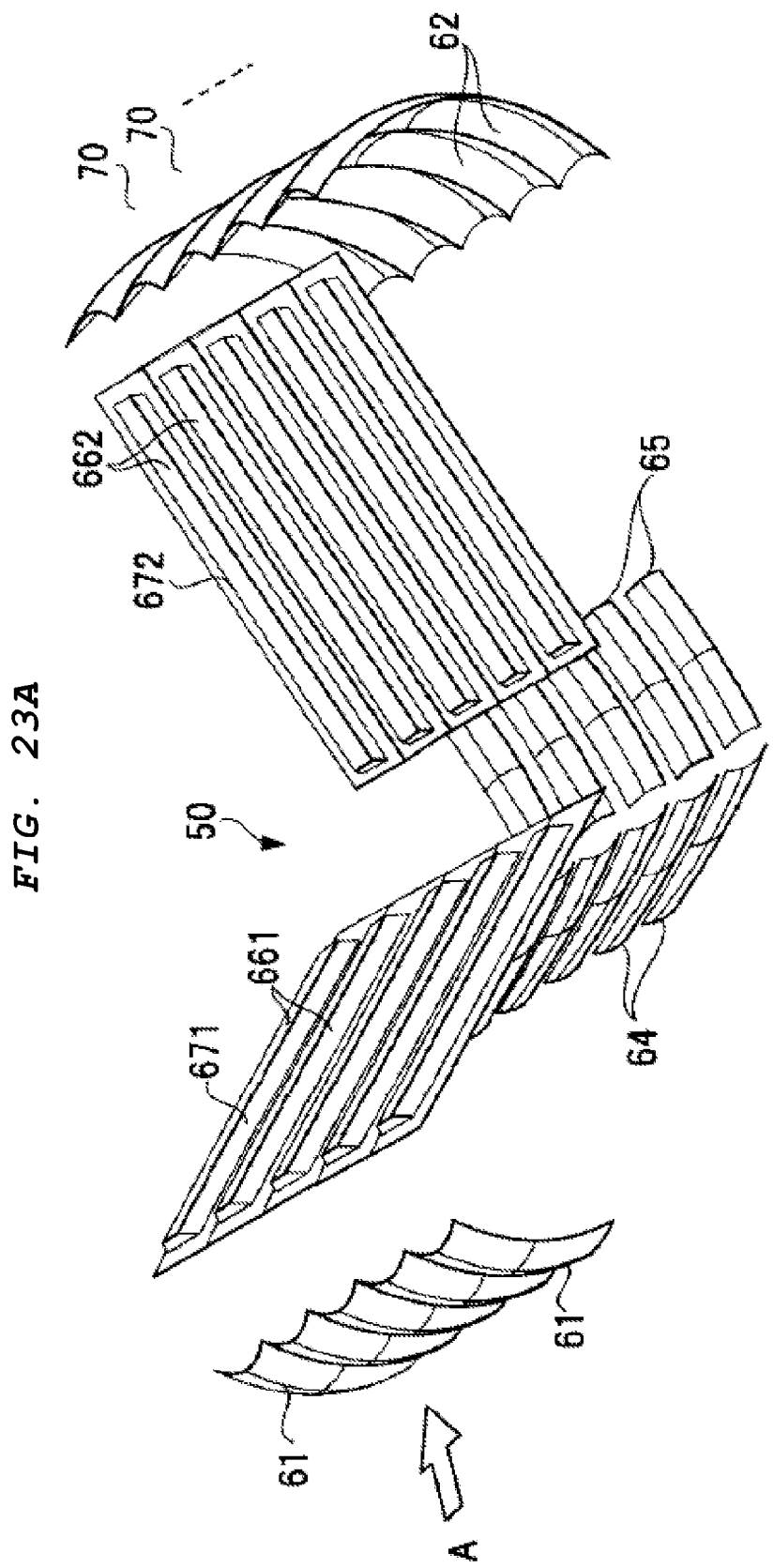
FIGS. 23A and 23B are diagrams illustrating the configuration of a modified example of the imaging device array according to the second embodiment.
Figure 23B:
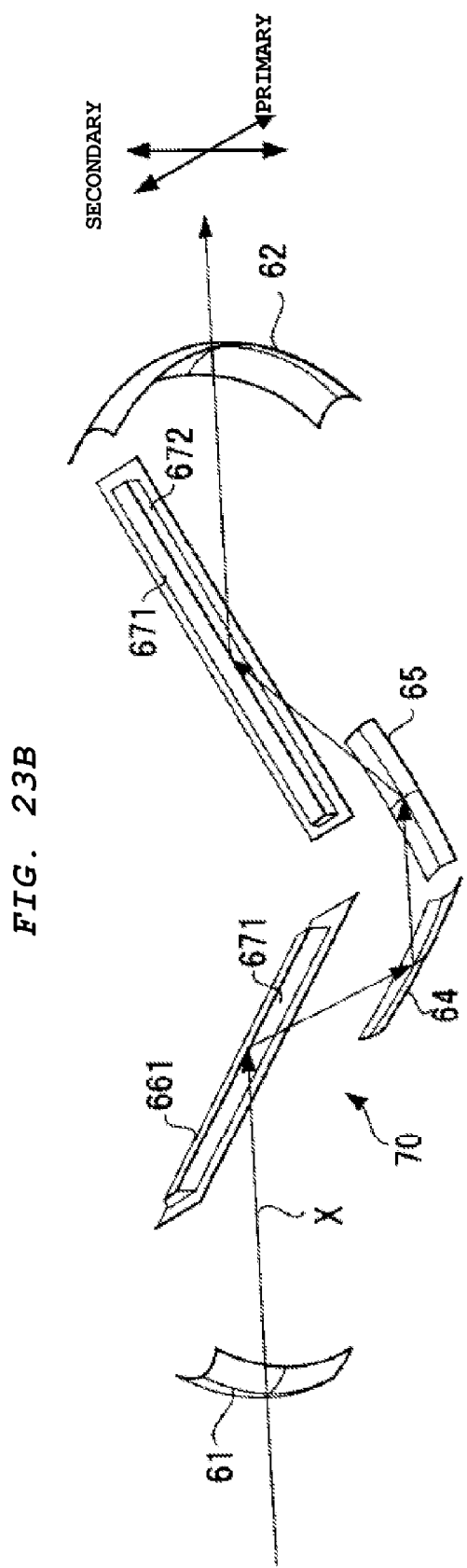

FIG. 23 illustrates the configuration of an imaging device array in a modified example of the second embodiment. In the example shown in FIGS. 23A and 23B, a mirror surface 661 having a protrusion 671 is arranged next to the lens surface 61 on the incidence side, and a mirror surface 662 having a protrusion 672 is arranged in front of the lens surface 62 on the exit side.

The undesired light rays can be eliminated from the image by the mirror surface 661 immediately after the lens surface 61. Also, remaining stray light can be eliminated (redirected from the image) before the exit lens surface 62 by the side walls of the protrusions 672. Consequently, it is possible to prevent the stray light from being incident on the exit surface.

Third Embodiment

Next, an imaging device array according to the third embodiment is described. The imaging device array 50 of the third embodiment reflects the light that enters from the incidence lens surface 61 a plurality of times (only twice) and leads it to the exit lens surface 62.

Figure 24B:
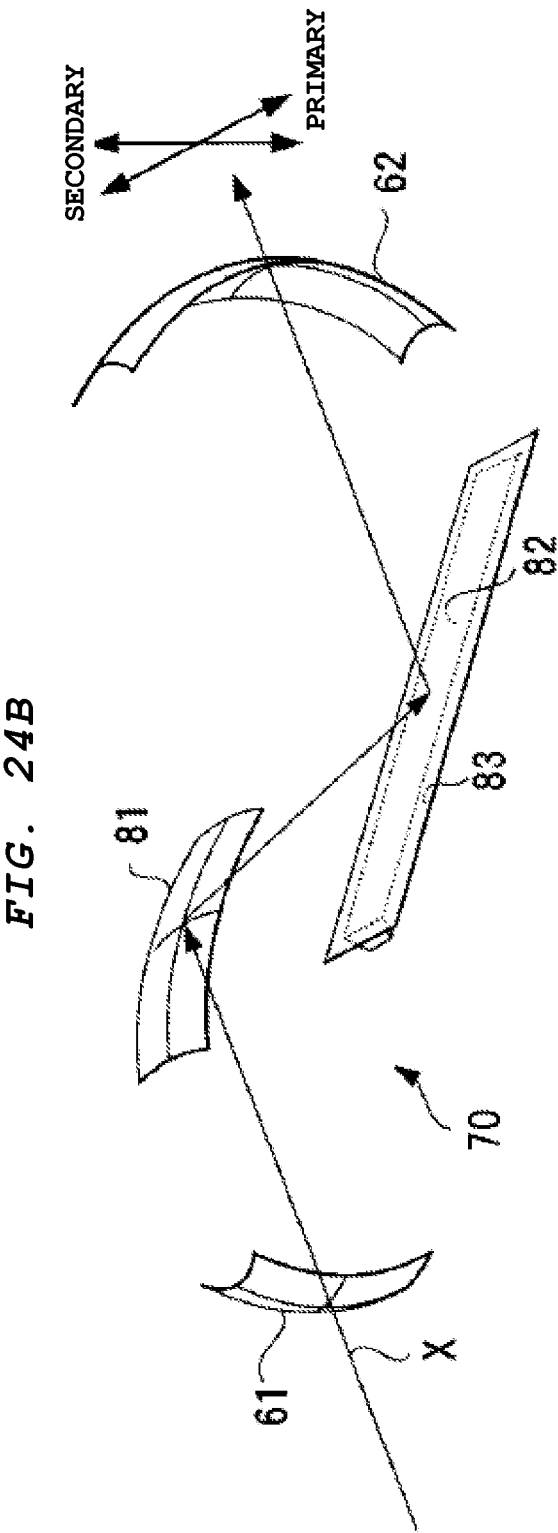

FIG. 24A is a diagram of the imaging device array 50 according to the third embodiment, and includes multiple imaging devices 70 having lens surfaces 61 that is the incidence surface, the lens surface 62 that is the exit surface, and mirror surfaces 81 and 82 that reflect the light that enters from the incidence lens surface 61 and reflect it twice to the exit lens surface 62. FIG. 24B shows one imaging device 70 of FIG. 24A.

In FIG. 24, the mirror surface are two surfaces, and the planar mirror surface 82 that has a protrusion 83 that protrudes therefrom is placed in front of the exit lens surface 62. The light X that enters the imaging device array 50 enters the lens surface 61 (incidence surface) and converges in both the primary scanning direction and the secondary scanning direction, and of those, the light beam that contributes to image forming reaches the mirror surface 81. All the light beams that enter the mirror surface 81 are reflected to the mirror surface 81, and of those, the light that contributes to image forming reaches the mirror surface 82.

Further, all of the light beams that enter the mirror surface 82 are reflected, and of those, the light beam that contributes to image forming is directed to the lens surface 62 (exit surface) and is image formed again by the lens surface 62, and forms an equal-magnification erect image on the image surface. The mirror surface 82 is formed at the apex of the protrusion 83, and light beams that enter the mirror surface 81 at an entry angle that fulfills the total refection condition are reflected to lens 62.

Figure 25B:
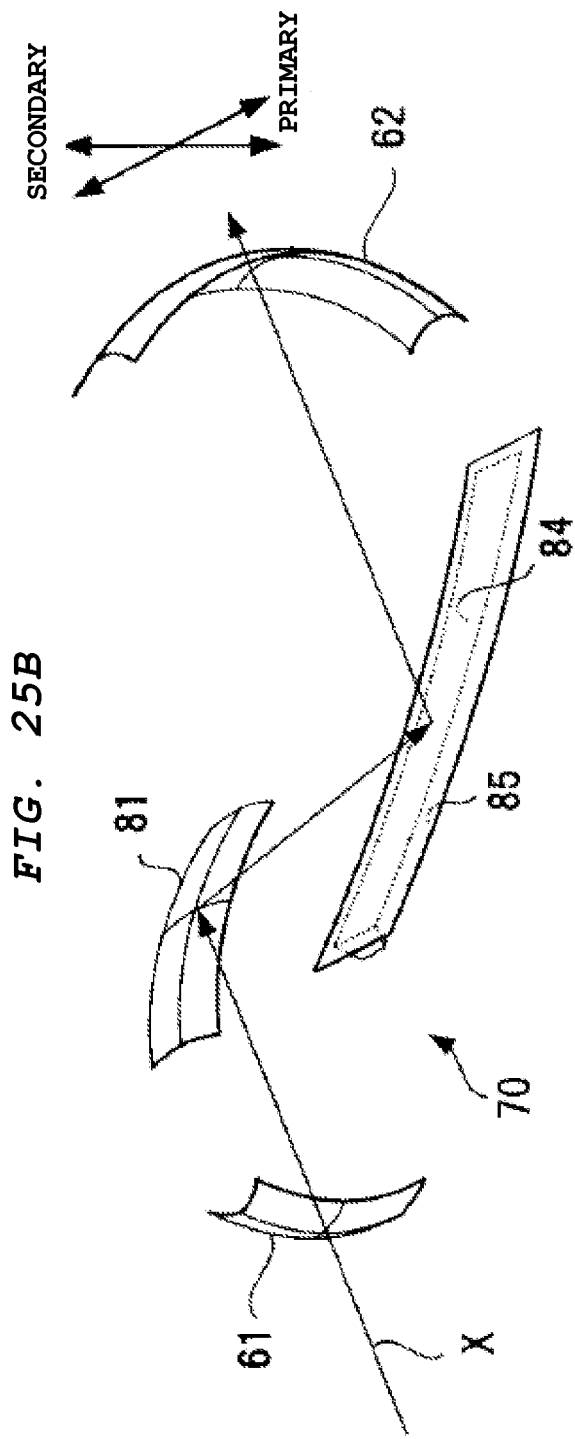

FIG. 25 is a diagram of an imaging device array of an alternate example of the third embodiment. The imaging device array 50 in FIG. 25A, like that of FIG. 24, includes the multiple imaging devices 70 that have the mirror surface 81 and a mirror surface 84 between the lens surface 61 that is the incidence surface and the lens surface 62 that is the exit surface. FIG. 25B shows one of the imaging devices 70 of FIG. 25A.

The mirror surface 84 is placed in front of the exit lens surface 62, and is formed on the apex of the protrusion 85 thereon. The mirror surface 84 is an adjustable free formed surface mirror that has a form that is asymmetric in the direction perpendicular to the primary scanning direction.

Figure 26A:
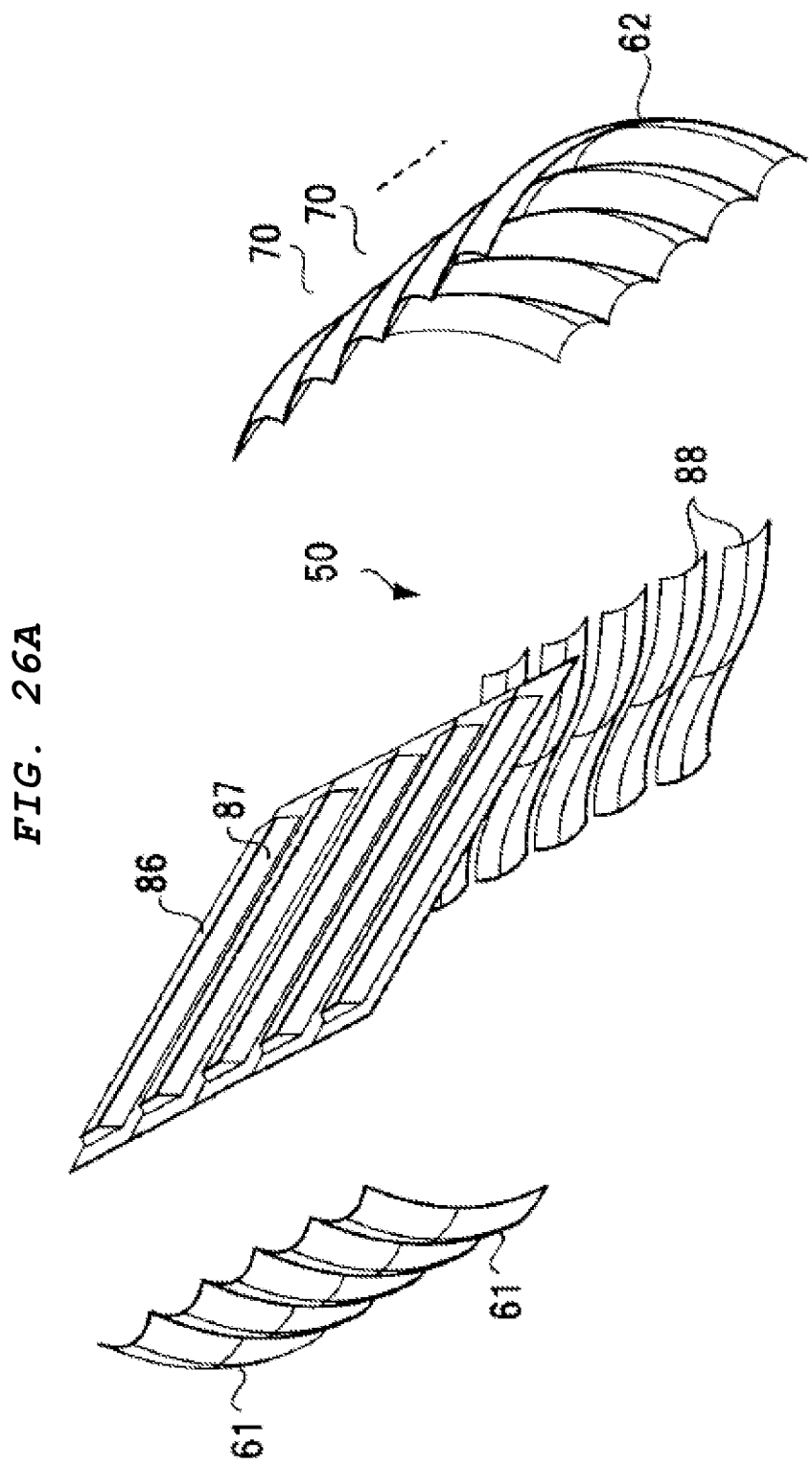

FIG. 26 is a diagram of an imaging device array 50 according to another alternate example of the third embodiment. The imaging device array 50 in FIG. 26A includes the multiple imaging devices 70 that have a mirror surface 86 and a mirror surface 88 between the lens surface 61 that is the incidence surface and the lens surface 62 that is the exit surface. FIG. 26B shows one such imaging device 70.

The mirror surface 86 which is formed at apex of the protrusion 87 is in a location next to the lens surface 21 on the incidence side. The mirror surface 86 is a flat mirror. Also, the mirror surface 88 is a free formed surface mirror that has a form that is asymmetric in the direction perpendicular to the primary scanning direction.

The mirror surface 88 has positive power in primary scanning direction and secondary scanning direction to increasing the light quantity contributing to the imaging.

Figure 27B:
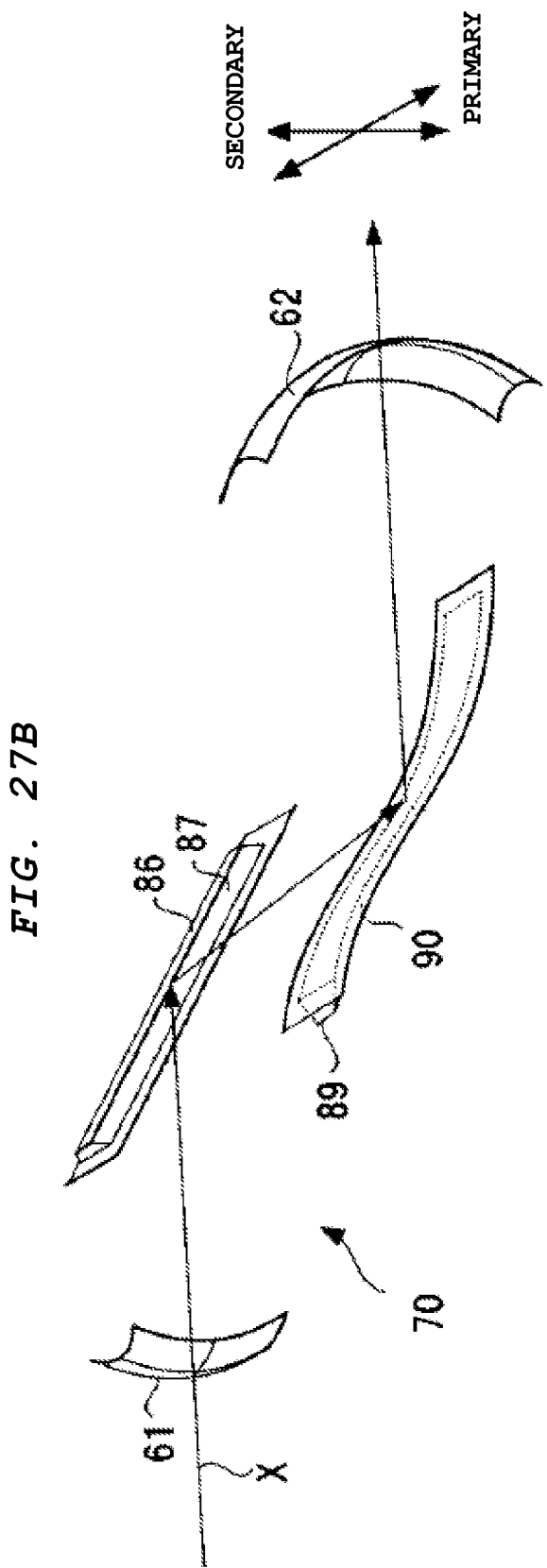

FIG. 27 is a diagram of an imaging device array according to yet another alternate example of the third embodiment. The imaging device array 50 in FIG. 27A includes the multiple imaging devices 70 that have the mirror surface 86 and a mirror surface 89 between the lens surface 61 that is the incidence surface and the lens surface 62 that is the exit surface. FIG. 27B shows one imaging device 70.

The mirror surface 86 is in a location next to the lens surface 61 on the incidence side, and is formed on the apex of the protrusion 87. The mirror surface 86 is a mirror that has a form that is asymmetric in the direction perpendicular to the primary scanning direction. Also, the mirror surface 89 is placed in front of the exit lens surface 62, and is formed on the apex of a protrusion 90. The mirror surface 89 is a free formed surface mirror that has a form that is asymmetric in the direction perpendicular to the primary scanning direction.

Fourth Embodiment

Next, an imaging device array according to the fourth embodiment is described. The imaging device array 50 of the fourth embodiment reflects the light that enters from the incidence lens surface 61 multiple rounds (three rounds) and leads it to the exit lens surface 62.

Figure 28A:
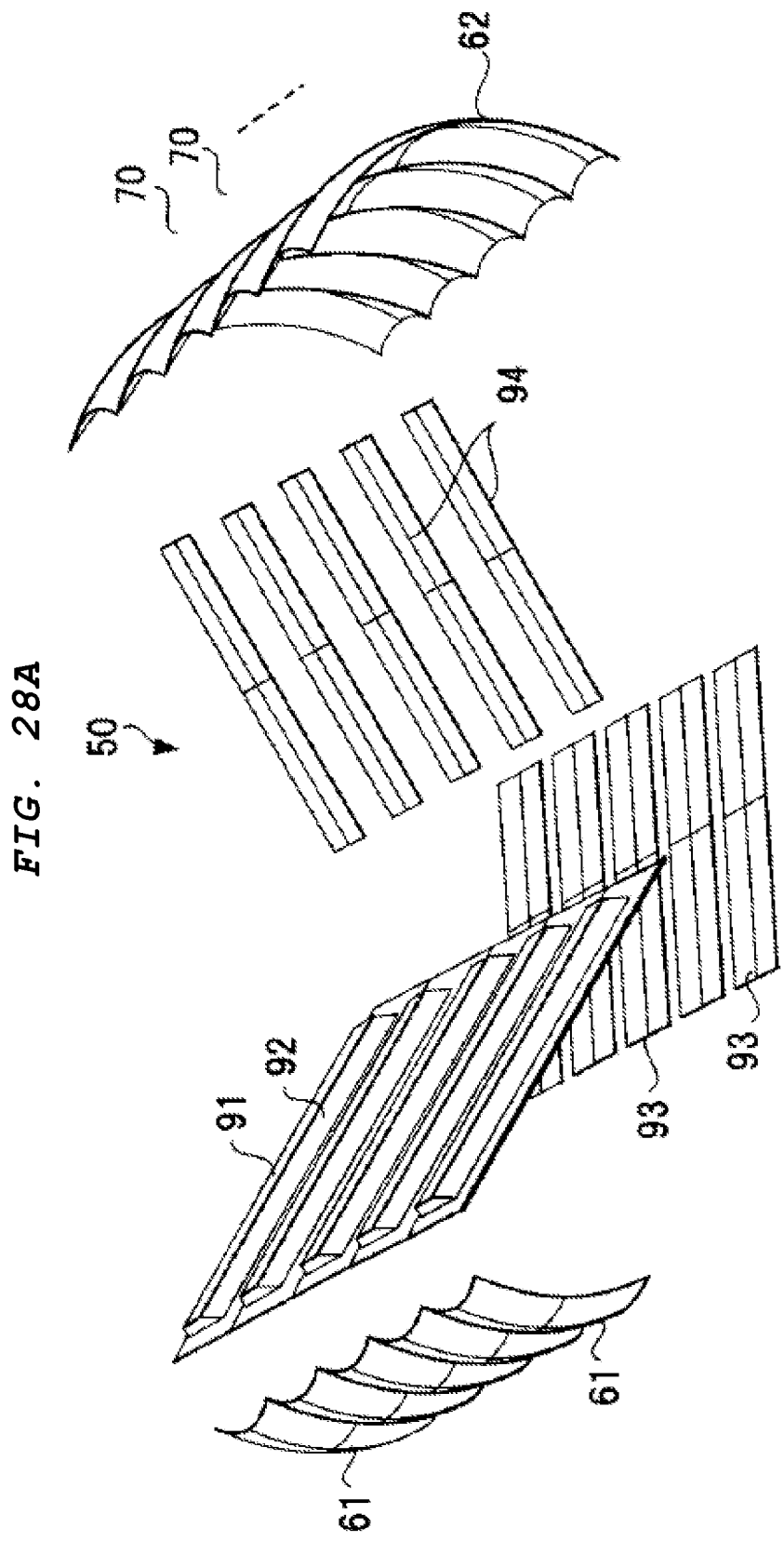
FIGS. 28A and 28B are diagrams of an imaging device array according to a fourth embodiment.
Figure 28B:
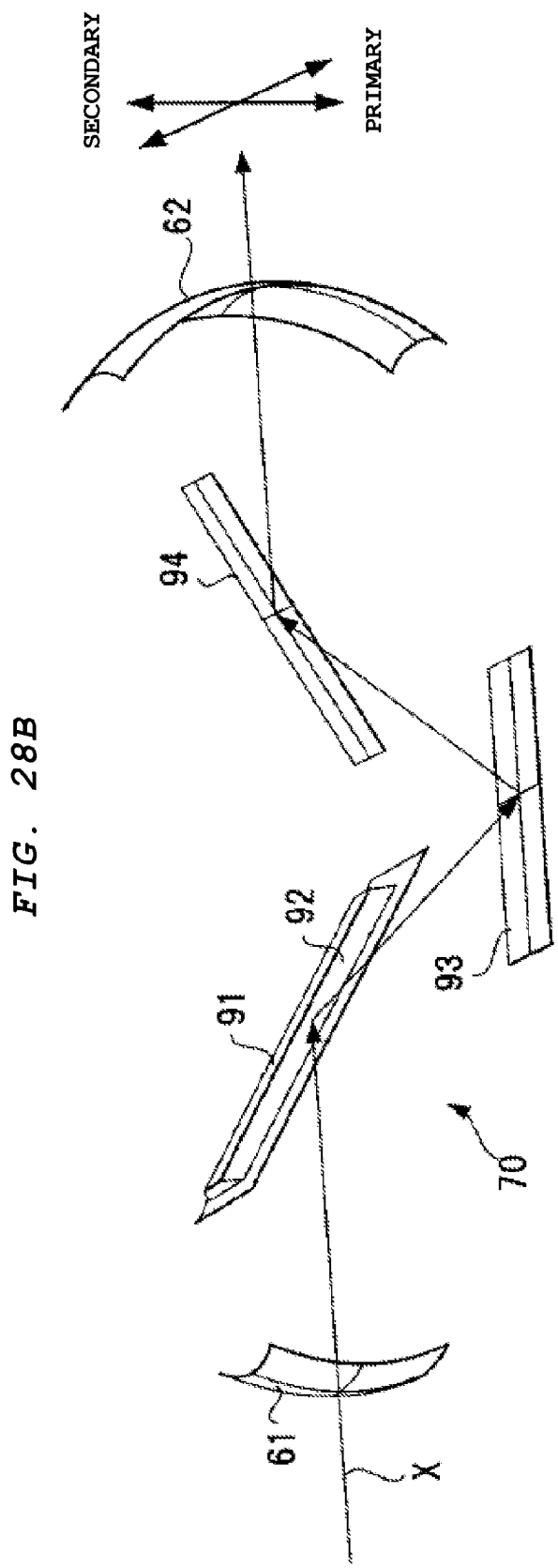

FIG. 28A is a diagram of the imaging device array 50 according to the fourth embodiment, and includes the multiple imaging devices 70 that have the lens surface 61 that is the incidence surface, the lens surface 62 that is the exit surface, and mirror surfaces 91, 93, and 94 that reflect the light that enters from the incidence lens surface 61 three times (off of three reflective surfaces) and reflect it to the exit lens surface 62. FIG. 28B shows one such imaging device 70.

The mirror surface 91 is in a location next to the lens surface 61 on the incidence side, and is a flat mirror that is formed on the apex of a protrusion 92. The light X that enters the imaging device array 50 enters the lens surface 61 (incidence surface) and converges in both the primary scanning direction and the secondary scanning direction, and of which the light beam that contributes to image forming enters the mirror surface 91. The entire light beam that enters the mirror surface 91 is reflected, and of which the light beam that contributes to image forming enters the mirror surface 93. The mirror surface 93 has positive power in primary scanning direction and secondary scanning direction to increasing the light quantity contributing to the imaging.

The entire light beam that enters the mirror surface 93 is reflected, and of which the light beam that contributes to image forming enters the mirror surface 94. All of the light beams that enter the mirror surface 94 are reflected, and of which the light beam that contributes to image forming, is led to the lens surface 62 (exit surface) and is image formed again by the lens surface 62, and forms an equal-magnification erect image on the image surface.

Figure 29A:
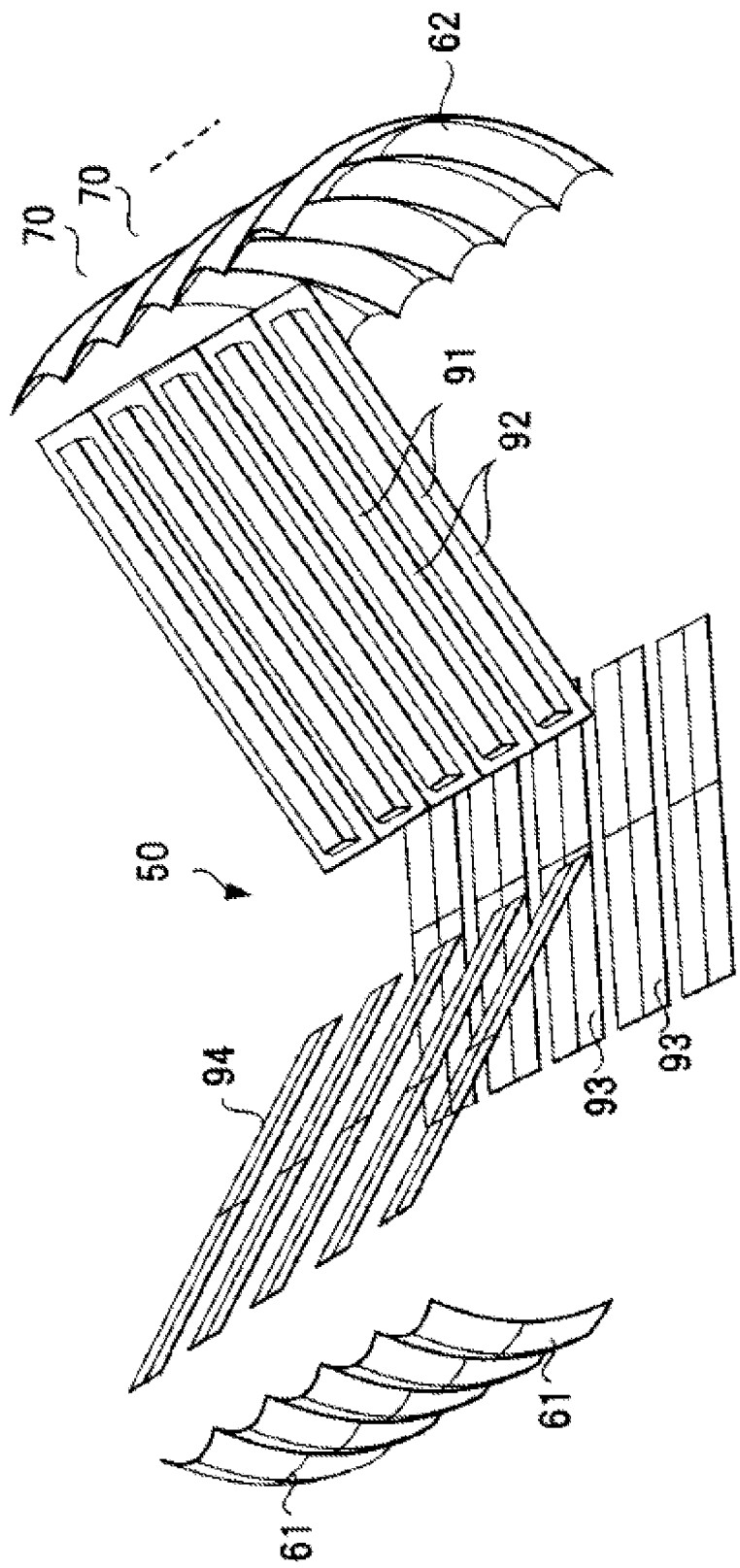
FIGS. 29A and 29B are diagrams that show an alternative example of the imaging device array according to the fourth embodiment.
Figure 29B:
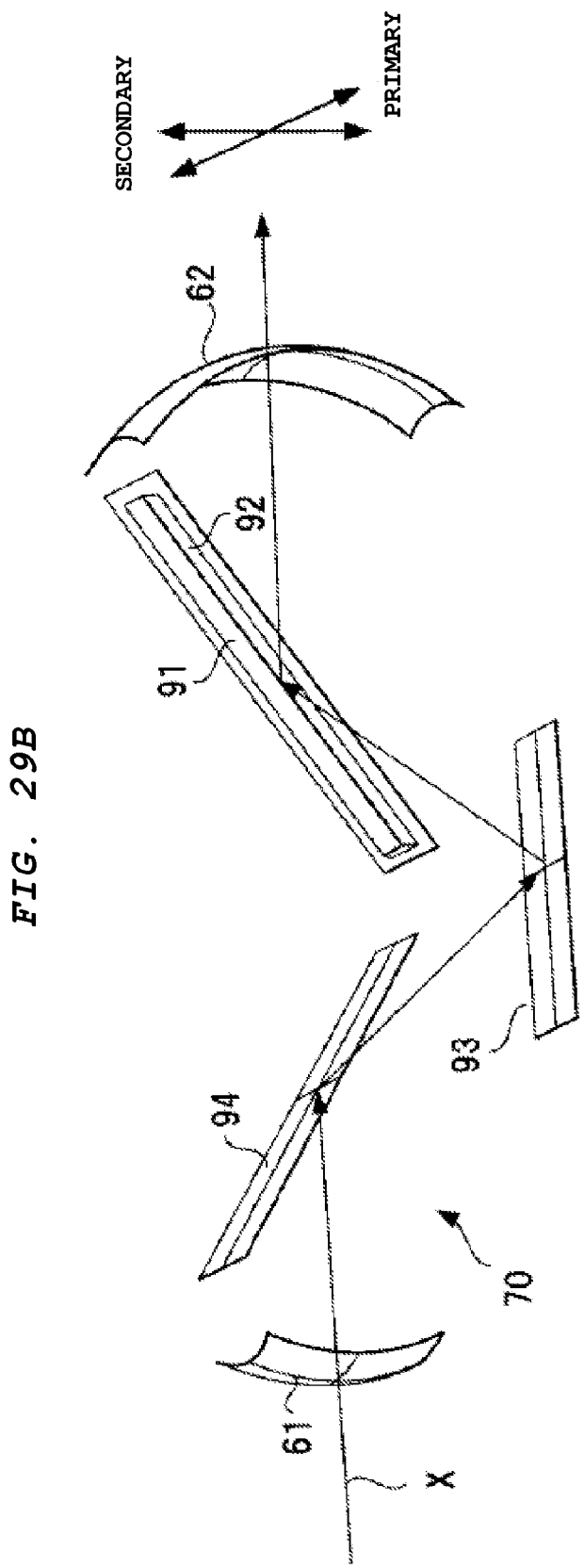

FIG. 29 is a diagram of an imaging device array of an alternate example of the fourth embodiment. The imaging device array 50 in FIG. 29A includes the multiple imaging devices 70 that places the mirror surface 91 in front of the exit lens surface 62 and places the mirror surface 94 in the position next to the incidence side lens surface 61. FIG. 29B shows one imaging device 70.

Figure 30B:
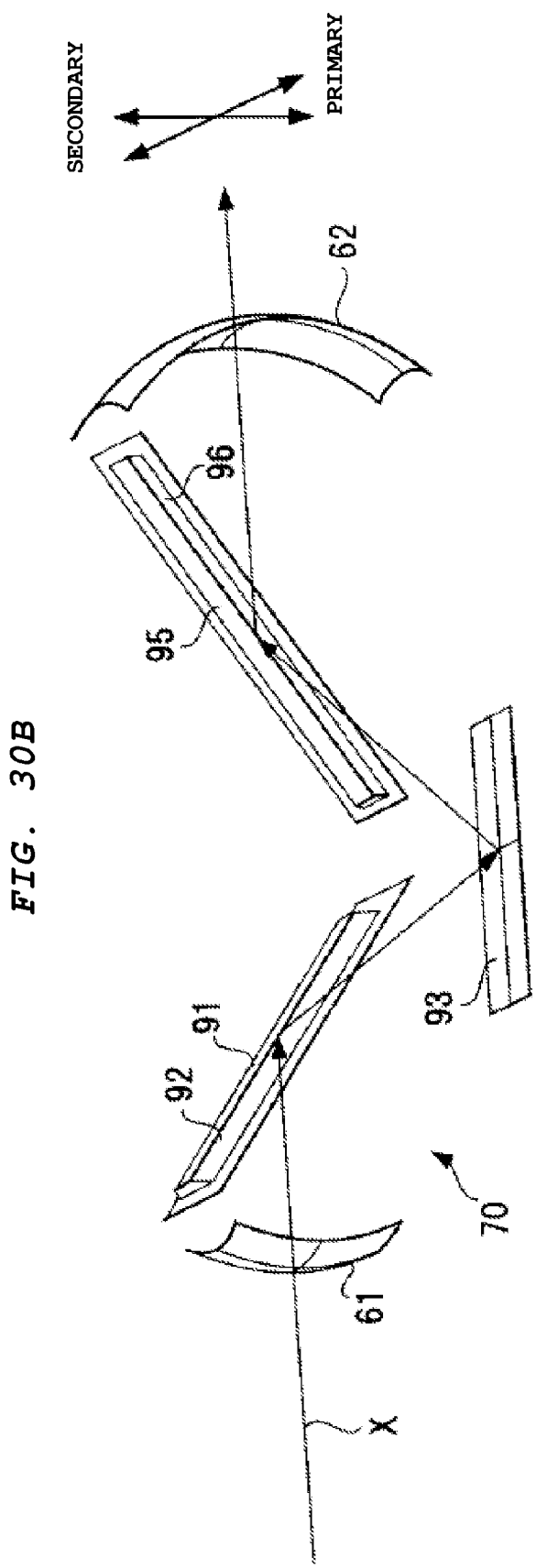

FIG. 30 is a diagram of an imaging device array of an alternate example of the fourth embodiment. The imaging device array 50 in FIG. 30A includes the multiple imaging devices 70 that place a mirror surface 95 in front of the exit lens surface 62 and place the mirror surface 91 in the position next to the incidence side lens surface 61. FIG. 30B shows one imaging device 70.

The mirror surface 91 is a flat mirror that is formed on the apex of the protrusion 92. Further, the mirror surface 95 is a flat mirror that is formed on the apex of a protrusion 96.

Fifth Embodiment

Next, an imaging device array according to a fifth embodiment is described. The imaging device array 50 of the fifth embodiment shown in FIG. 31 is one wherein an incidence surface 101 and an exit surface 102 are flat, and reflects the light that enters from the incidence surface 101 multiple rounds (six rounds) and leads it to the exit surface 102.

Figure 31A:
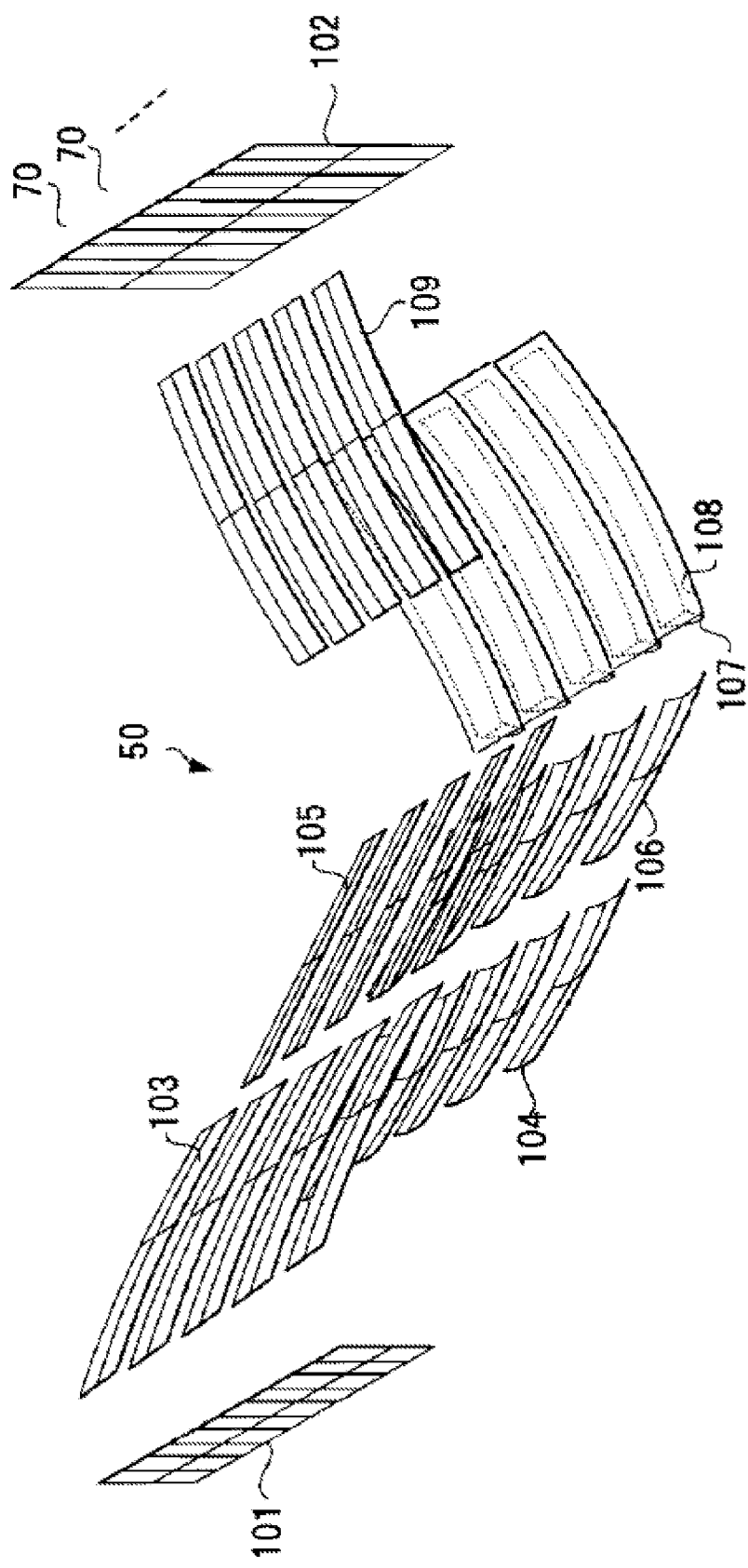
FIGS. 31A and 31B are diagrams of an imaging device array according to a fifth embodiment.
Figure 31B:
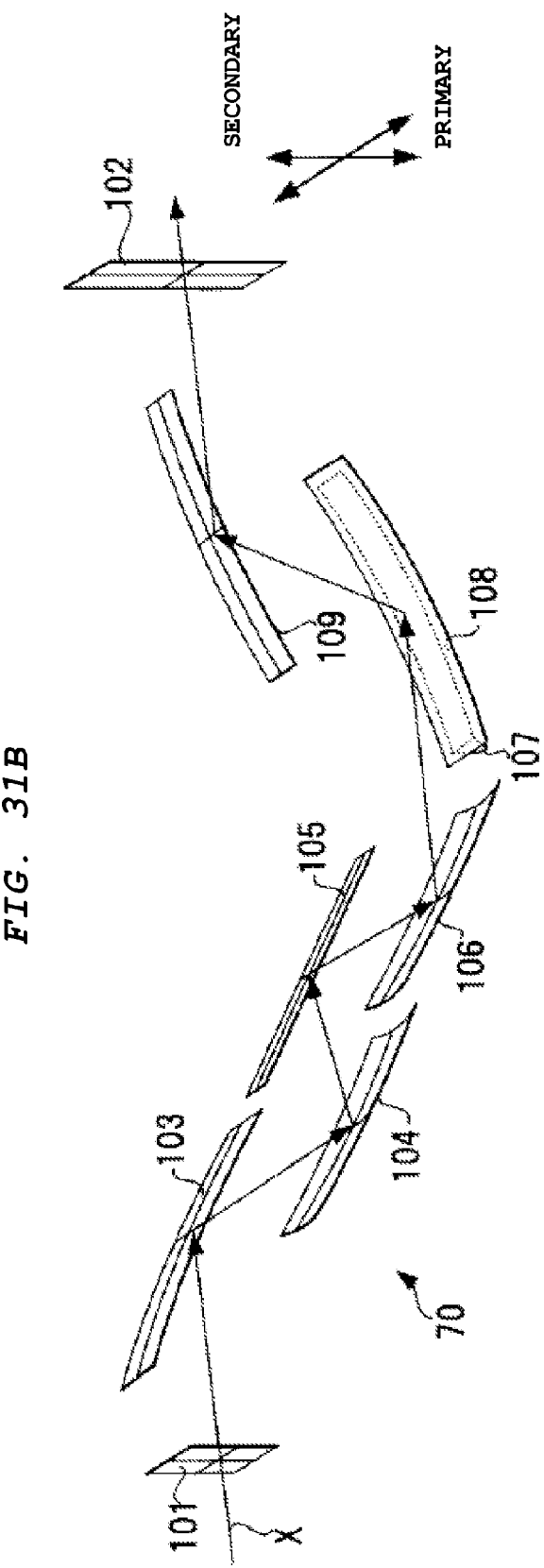

The imaging device array 50 in FIG. 31A includes the multiple imaging devices 70 that have the incidence surface 101, the exit surface 102, and mirror surfaces 103, 104, 105, 106, 107, and 109 that reflect the light that enters from the incidence surface 101 six times and reflect it to the exit surface 102. FIG. 31B shows one imaging device 70.

The mirror surface 103 has the power to converge light in the primary and secondary scanning directions, and has the role of the lens surface 61 on the incidence side of the embodiments mentioned above. Further, the mirror surface 109 has the power to converge light in the primary and secondary scanning directions, and is a mirror surface that is asymmetric in the direction perpendicular to the primary scanning direction, and has the role of the lens surface 62 of the exit side in the previous embodiments.

The incidence surface 101 and the exit surface 102 have surfaces edges that coincide with the boundary with the adjacent mirror sets. Further, between the mirror surface 103 and the mirror surface 109 are four mirror surfaces 104, 105, 106, and 107.

The mirror surfaces 104, 105, and 106 have forms that are asymmetric in the direction perpendicular to the primary scanning direction. The mirror surface 107 that is placed in front of the mirror surface 109 is formed on the apex of a protrusion 108, and is a free formed surface mirror that has a form that is asymmetric in the direction perpendicular to the primary scanning direction.

Meanwhile, at least one of the mirror surface 104 that is placed next to the mirror surface 103 or the mirror surface 107 that is placed in front of the mirror surface 109 can be formed on the apex of the protrusion, and be a mirror that has a form that is asymmetric in the direction perpendicular to the primary scanning direction, and be made an free formed surface mirror or a flat mirror.

At least one of the mirror surface has positive power in primary scanning direction to increasing the light quantity contributing to the imaging.

In all embodiments, depending on the required specification, several of the mirror surfaces can be made a form that is also symmetric in the direction perpendicular to the primary scanning direction or a flat surface. Also, in between several mirror surfaces can also be a form in which the mirrors are touching each other, without installing a propagating stopping surface.

In the embodiments, those with the same name are described using the same codes, but those with the same codes do not necessarily mean that their forms are also the same. For example, the incidence lens surface in FIG. 6 and the incidence lens surface in FIG. 20 are both given the code 61, but their forms are different. Similarly, the incidence mirror surface 63 in FIG. 6 and the incidence mirror surface 63 in FIG. 20, the mirror surface 64 in FIG. 6 and the mirror surface 64 in FIG. 20, the mirror surface 65 in FIG. 6 and the mirror 65 in FIG. 20 are each given the same code, but their forms are different.

Thus, according to the imaging device array of the embodiments described above, since the imaging device array is formed with only a single molding, the relative misalignment in the positions of the lens and mirror can be suppressed. Therefore, a high quality image can be formed by applying to an image forming apparatus. Further, the imaging device array of the embodiments has a small slit amount for light shielding, so the ratio of the height and width of the array (the aspect ratio) is small, making it easy to mold and manufacture molds, and making it possible to shorten the molding cycle time.

In the present embodiment, an MFP is described as the image forming apparatus, but it is not limited thereto. Cases where the image forming apparatus is applied to the image reading apparatus of a standalone scanner, or is applied to the light scanning apparatus of a standalone electronic photographic printer are also included in the scope of the image forming apparatus of the present embodiment.

While certain embodiments have been described, these embodiments have been presented by way of example only, and they are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An imaging device array for an imaging apparatus having a primary and a secondary scanning direction comprising:
   a plurality of imaging devices integrally including an incidence surface that converges light in the primary scanning direction;
   a plurality of reflective surfaces that reflect light from the incidence surface multiple times;
   and an exit surface that outputs light that has gone through the plurality of reflective surfaces; wherein
   in the imaging device, at least one of the plurality of reflective surfaces is formed on the apex of a protrusion, and the light that exits the imaging device at the exit surface is imaged at an image point.

2. The imaging device array according to claim 1, wherein the imaging device includes an incidence lens surface to which light enters as the incidence surface, and has an exit lens surface through which light that has been reflected by the plurality of reflective surfaces exits the imaging device; and
   the plurality of imaging devices are arranged in the primary scanning direction of an imaging apparatus.

3. The imaging device array according to claim 1, wherein in the imaging device, among the plurality of reflective surfaces, at least one of a first reflective surface that is positioned adjacent to the incidence surface and a second reflective surface that is positioned adjacent to the exit surface is formed on the apex of a protrusion.

4. The imaging device array according to claim 3, wherein in the imaging device, a light shielding layer is formed on a wall surface of the protrusion on which the first reflective surface or the second reflective surface is formed.

5. The imaging device array according to claim 1, wherein, among the plurality of reflective surfaces, at least one has a shape that is each asymmetric in the direction perpendicular to the primary scanning direction.

6. The imaging device array according to claim 1, wherein the plurality of reflective surfaces are arranged with an angle that fulfills a total reflection condition to all of the light that contribute to image forming.

7. The imaging device array according to claim 1, wherein the incidence surface or the exit surface of the plurality of imaging devices that are arranged in the primary scanning direction respectively are in contact with one another.

8. The imaging device array according to claim 1, wherein a plurality of imaging devices are provided, and a surface that inhibits the progression of light other than light that is reflected at the reflective surfaces to the exit surface is formed on at least one of the plurality of reflective surfaces.

9. An imaging device array comprising:
   a plurality of imaging devices integrally including a lens surface or a mirror surface that converges light in the primary scanning direction;
   a plurality of reflective surfaces that reflect light from the lens surface or the mirror surface that converges the light in the primary scanning direction multiple rounds; and
   an exit surface that through which light that has been reflected at the plurality of reflective surfaces exits, wherein
   at least one of the plurality of reflective surfaces is formed at the apex of a protrusion and the light that exits from the exit surface is imaged at an image point.

10. The imaging device array of claim 9, wherein the plurality of reflective surfaces comprises more than one and less than seven.

11. The imaging device array of claim 9, wherein a reflective surface formed at the apex of the protrusion is tapered in the direction of light passing through the imaging device array.

12. The imaging device array of claim 11, wherein the tapered surface is a flat mirror having a smaller reflective surface width in the taper direction thereof.

13. The imaging device array of claim 12, wherein at least one of the reflective surfaces is a focusing surface.

14. The imaging device array of claim 9, wherein at least one reflective surface has positive power in primary scanning direction.

15. A method of directing light from an original image to an image plane, comprising:
   providing a plurality of reflective surfaces, wherein at least one reflective surface disposed between the original image and image plane is formed having a side wall extending therefrom in the direction of light incident thereon; and
   reflecting stray light at the sidewall and directing the light to a location other than the image plane.

16. The method of claim 15, further including the step of providing a lens adjacent to the original image.

17. The method of claim 16, further including the step of positioning a plurality of individual first lenses side by said across the primary scanning direction of an image, wherein each lens is coupled to discrete reflective surfaces.

18. The method of claim 17, further including the step of providing exit lenses at the image plane, each lens in light communication with a single first lens.

19. The method of claim 18, wherein at least one of the reflective surfaces has positive power in secondary scanning direction.

20. The method of claim 15, wherein at least one of the reflective surfaces is asymmetric.

* * * * *